United States Patent
Cheng et al.

(10) Patent No.: US 9,455,299 B2
(45) Date of Patent: Sep. 27, 2016

(54) METHODS FOR SEMICONDUCTOR SENSOR STRUCTURES WITH REDUCED DISLOCATION DEFECT DENSITIES

(71) Applicant: TAIWAN SEMICONDUCTOR MANUFACTURING COMPANY, LTD., Hsin-Chu (TW)

(72) Inventors: Zhiyuan Cheng, Lincoln, MA (US); James Fiorenza, Wilmington, MA (US); Calvin Sheen, Derry, NH (US); Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/755,665

(22) Filed: Jun. 30, 2015

(65) Prior Publication Data
US 2015/0325619 A1    Nov. 12, 2015

Related U.S. Application Data

(60) Continuation of application No. 14/333,204, filed on Jul. 16, 2014, now Pat. No. 9,105,549, which is a continuation of application No. 13/594,519, filed on Aug. 24, 2012, now Pat. No. 8,809,106, which is a (Continued)

(51) Int. Cl.
*H01L 21/00* (2006.01)
*H01L 27/146* (2006.01)
(Continued)

(52) U.S. Cl.
CPC ... *H01L 27/14689* (2013.01); *H01L 21/02532* (2013.01); *H01L 27/1446* (2013.01);
(Continued)

(58) Field of Classification Search
CPC .............. H01L 21/02532; H01L 21/76224; H01L 21/02647; H01L 21/02521; H01L 21/02639; H01L 21/02381; H01L 27/14689; H01L 27/14612; H01L 27/14643; H01L 27/1446; H01L 31/1037; H01L 31/105; H01L 31/0304; H01L 31/103; H01L 31/0312; H01L 31/03046; Y02P 70/521; Y02E 10/544
See application file for complete search history.

(56) References Cited

U.S. PATENT DOCUMENTS 4,307,510 A    12/1981    Sawyer et al.
4,322,253 A     3/1982    Pankove et al.
(Continued)

FOREIGN PATENT DOCUMENTS

CN    2550906     5/2003
CN    101268547   9/2008
(Continued)

OTHER PUBLICATIONS

Kwok K. Ng, "Resonant-Tunneling Diode," Complete Guide to Semiconductor Devices, Chapter 10. Nov. 3, 2010, pp. 75-83.
(Continued)

*Primary Examiner* — Nikolay Yushin
(74) *Attorney, Agent, or Firm* — Slater Matsil, LLP

(57) ABSTRACT

Non-silicon based semiconductor devices are integrated into silicon fabrication processes by using aspect-ratio-trapping materials. Non-silicon light-sensing devices in a least a portion of a crystalline material can output electrons generated by light absorption therein. Exemplary light-sensing devices can have relatively large micron dimensions. As an exemplary application, complementary-metal-oxide-semiconductor photodetectors are formed on a silicon substrate by incorporating an aspect-ratio-trapping technique.

20 Claims, 14 Drawing Sheets

Related U.S. Application Data division of application No. 12/565,863, filed on Sep. 24, 2009, now Pat. No. 8,253,211.

(60) Provisional application No. 61/099,902, filed on Sep. 24, 2008.

(51) Int. Cl.

| | | |
|---|---|---|
| *H01L 27/144* | (2006.01) | |
| *H01L 31/0304* | (2006.01) | |
| *H01L 31/0312* | (2006.01) | |
| *H01L 31/103* | (2006.01) | |
| *H01L 31/105* | (2006.01) | |
| *H01L 21/02* | (2006.01) | |
| *H01L 21/762* | (2006.01) | |

(52) U.S. Cl.
CPC ... *H01L27/14612* (2013.01); *H01L 27/14643* (2013.01); *H01L 31/0304* (2013.01); *H01L 31/0312* (2013.01); *H01L 31/03046* (2013.01); *H01L 31/103* (2013.01); *H01L 31/105* (2013.01); *H01L 31/1037* (2013.01); *H01L 21/02381* (2013.01); *H01L 21/02521* (2013.01); *H01L 21/02639* (2013.01); *H01L 21/02647* (2013.01); *H01L 21/76224* (2013.01); *Y02E 10/544* (2013.01)

(56) References Cited

U.S. PATENT DOCUMENTS

| | | |
|---|---|---|
| 4,370,510 A | 1/1983 | Stirn |
| 4,545,109 A | 10/1985 | Reichert |
| 4,551,394 A | 11/1985 | Betsch et al. |
| 4,651,179 A | 3/1987 | Reichert |
| 4,727,047 A | 2/1988 | Bozler et al. |
| 4,762,382 A * | 8/1988 | Husain ............... G02B 6/43 385/132 |
| 4,774,205 A | 9/1988 | Choi et al. |
| 4,789,643 A | 12/1988 | Kajikawa |
| 4,826,784 A | 5/1989 | Salerno et al. |
| 4,860,081 A | 8/1989 | Cogan |
| 4,876,210 A | 10/1989 | Barnett et al. |
| 4,948,456 A | 8/1990 | Schubert |
| 4,963,508 A | 10/1990 | Umeno et al. |
| 5,032,893 A | 7/1991 | Fitzgerald, Jr. et al. |
| 5,034,337 A | 7/1991 | Mosher et al. |
| 5,061,644 A | 10/1991 | Yue et al. |
| 5,079,616 A | 1/1992 | Yacobi et al. |
| 5,084,409 A * | 1/1992 | Beam, III ........... H01L 21/7605 148/33.4 |
| 5,091,333 A | 2/1992 | Fan et al. |
| 5,091,767 A | 2/1992 | Bean et al. |
| 5,093,699 A | 3/1992 | Weichold et al. |
| 5,098,850 A | 3/1992 | Nishida et al. |
| 5,105,247 A | 4/1992 | Cavanaugh |
| 5,108,947 A | 4/1992 | Demeester et al. |
| 5,156,995 A | 10/1992 | Fitzgerald, Jr. et al. |
| 5,159,413 A | 10/1992 | Calviello et al. |
| 5,164,359 A | 11/1992 | Calviello et al. |
| 5,166,767 A | 11/1992 | Kapoor et al. |
| 5,223,043 A | 6/1993 | Olson et al. |
| 5,236,546 A | 8/1993 | Mizutani |
| 5,238,869 A | 8/1993 | Shichijo et al. |
| 5,256,594 A | 10/1993 | Wu et al. |
| 5,269,852 A | 12/1993 | Nishida |
| 5,269,876 A | 12/1993 | Mizutani |
| 5,272,105 A | 12/1993 | Yacobi et al. |
| 5,281,283 A | 1/1994 | Tokunaga et al. |
| 5,285,086 A | 2/1994 | Fitzgerald, Jr. |
| 5,295,150 A | 3/1994 | Vangieson et al. |
| 5,356,831 A | 10/1994 | Calviello et al. |
| 5,403,751 A | 4/1995 | Nishida et al. |
| 5,405,453 A | 4/1995 | Ho et al. |
| 5,407,491 A | 4/1995 | Freundlich et al. |
| 5,410,167 A | 4/1995 | Saito |
| 5,417,180 A | 5/1995 | Nakamura |
| 5,427,976 A | 6/1995 | Koh et al. |
| 5,432,120 A | 7/1995 | Meister et al. |
| 5,438,018 A | 8/1995 | Mori et al. |
| 5,461,243 A | 10/1995 | Ek et al. |
| 5,518,953 A | 5/1996 | Takasu |
| 5,528,209 A | 6/1996 | MacDonald et al. |
| 5,545,586 A | 8/1996 | Koh |
| 5,548,129 A | 8/1996 | Kubena |
| 5,589,696 A | 12/1996 | Baba |
| 5,621,227 A | 4/1997 | Joshi |
| 5,622,891 A | 4/1997 | Saito |
| 5,640,022 A | 6/1997 | Inai |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,825,240 A | 10/1998 | Geis et al. |
| 5,849,077 A | 12/1998 | Kenney |
| 5,853,497 A | 12/1998 | Lillington et al. |
| 5,869,845 A | 2/1999 | Vander Wagt et al. |
| 5,883,549 A | 3/1999 | De Los Santos |
| 5,886,385 A | 3/1999 | Arisumi et al. |
| 5,903,170 A | 5/1999 | Kulkarni et al. |
| 5,953,361 A | 9/1999 | Borchert et al. |
| 5,959,308 A | 9/1999 | Shichijo et al. |
| 5,966,620 A | 10/1999 | Sakaguchi et al. |
| 5,998,781 A | 12/1999 | Vawter et al. |
| 6,011,271 A | 1/2000 | Sakuma et al. |
| 6,015,979 A | 1/2000 | Sugiura et al. |
| 6,049,098 A | 4/2000 | Sato |
| 6,083,598 A | 7/2000 | Ohkubo et al. |
| 6,100,106 A | 8/2000 | Yamaguchi et al. |
| 6,110,813 A | 8/2000 | Ota et al. |
| 6,111,288 A | 8/2000 | Watanabe et al. |
| 6,121,542 A | 9/2000 | Shiotsuka et al. |
| 6,150,242 A | 11/2000 | Van de Wagt et al. |
| 6,153,010 A | 11/2000 | Kiyoku et al. |
| 6,191,432 B1 | 2/2001 | Sugiyama et al. |
| 6,225,650 B1 | 5/2001 | Tadatomo et al. |
| 6,228,691 B1 | 5/2001 | Doyle |
| 6,229,153 B1 | 5/2001 | Botez et al. |
| 6,235,547 B1 | 5/2001 | Sakuma et al. |
| 6,252,261 B1 | 6/2001 | Usui et al. |
| 6,252,287 B1 | 6/2001 | Kurtz et al. |
| 6,271,551 B1 | 8/2001 | Schmitz et al. |
| 6,274,889 B1 | 8/2001 | Ota et al. |
| 6,300,650 B1 | 10/2001 | Sato |
| 6,320,220 B1 | 11/2001 | Watanabe et al. |
| 6,325,850 B1 | 12/2001 | Beaumont et al. |
| 6,339,232 B1 | 1/2002 | Takagi |
| 6,342,404 B1 | 1/2002 | Shibata et al. |
| 6,348,096 B1 | 2/2002 | Sunakawa et al. |
| 6,352,942 B1 | 3/2002 | Luan et al. |
| 6,362,071 B1 | 3/2002 | Nguyen et al. |
| 6,380,051 B1 | 4/2002 | Yuasa et al. |
| 6,380,590 B1 | 4/2002 | Yu |
| 6,403,451 B1 | 6/2002 | Linthicum et al. |
| 6,407,425 B1 | 6/2002 | Babcock et al. |
| 6,456,214 B1 | 9/2002 | van de Wagt |
| 6,458,614 B1 | 10/2002 | Nanishi et al. |
| 6,475,869 B1 | 11/2002 | Yu |
| 6,492,216 B1 | 12/2002 | Yeo et al. |
| 6,500,257 B1 | 12/2002 | Wang et al. |
| 6,503,610 B2 | 1/2003 | Hiramatsu et al. |
| 6,512,252 B1 | 1/2003 | Takagi et al. |
| 6,521,514 B1 | 2/2003 | Gehrke et al. |
| 6,552,259 B1 | 4/2003 | Hosomi et al. |
| 6,566,284 B2 | 5/2003 | Thomas, III et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |

(56) References Cited

U.S. PATENT DOCUMENTS

| | | |
|---|---|---|
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,053 B1 | 11/2004 | Kong et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,705,370 B2 | 4/2010 | Fitzgerald |
| 7,777,250 B2 | 8/2010 | Lochtefeld |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa et al. |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |

(56) References Cited

U.S. PATENT DOCUMENTS

| | | |
|---|---|---|
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0176371 A1 | 7/2010 | Lochtefeld |
| 2010/0176375 A1 | 7/2010 | Lochtefeld |
| 2010/0213511 A1 | 8/2010 | Lochtefeld |
| 2010/0216277 A1 | 8/2010 | Fiorenza et al. |
| 2010/0252861 A1 | 10/2010 | Lochtefeld |
| 2010/0308376 A1 | 12/2010 | Takada et al. |

(56) References Cited

U.S. PATENT DOCUMENTS

| | | |
|---|---|---|
| 2011/0011438 A1 | 1/2011 | Li |
| 2011/0049568 A1 | 3/2011 | Lochtefeld et al. |
| 2011/0086498 A1 | 4/2011 | Cheng et al. |

FOREIGN PATENT DOCUMENTS

| | | |
|---|---|---|
| CN | 101300663 | 11/2008 |
| DE | 10017137 | 10/2000 |
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |
| GB | 2215514 | 9/1989 |
| JP | 2062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2008546181 A | 12/2008 |
| JP | 2009177167 | 8/2009 |
| KR | 20030065631 | 8/2003 |
| KR | 20090010284 | 1/2009 |
| TW | 544930 | 8/2003 |
| WO | WO0072383 | 11/2000 |
| WO | WO0101465 | 1/2001 |
| WO | WO0209187 | 1/2002 |
| WO | WO02086952 | 10/2002 |
| WO | WO02088834 | 11/2002 |
| WO | WO03073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO2007014294 | 2/2007 |
| WO | WO2008124154 | 10/2008 |
| WO | 2009035746 A2 | 3/2009 |

OTHER PUBLICATIONS

"Communication pursuant to Article 94(3) EPC," Application No. 06 770 525.1-2203, Applicant: Taiwan Semiconductor Company, Ltd., Feb. 17, 2011, 4 pages.

68 Applied Physics Letters 7, 1999, pp. 774-779 (trans. of relevant portions attached).

Ames, "Intel Says More Efficient Chips are Coming," PC World, available at: http://www.pcworld.com/printable/article/id,126044/printable.html (Jun. 12, 2006); 4 pages.

Asano et al., "AlGaInN laser diodes grown on an ELO-GaN substrate vs. on a sapphire substrate," Semiconductor Laser Conference (2000) Conference Digest, IEEE 17$^{th}$ International, 2000, pp. 109-110.

Asaoka, et al., "Observation of 1 $^x$/noise of GaInP/GaAs triple barrier resonant tunneling diodes," AIP Conf. Proc., vol. 780, Issue 1, 2005, pp. 492-495.

Ashby, et al., "Low-dislocation-density GaN from a single growth on a textured substrate," Applied Physics Letters, vol. 77, No. 20, Nov. 13, 2000, pp. 3233-3235.

Ashley, et al., "Heterogeneous InSb Quantum Well Transistors on Silicon for Ultra-High Speed, Low Power Logic Applications," 43 Electronics Letters 14, Jul. 2007, 2 pages.

Bai et al., "Study of the Defect Elimination Mechanisms in Aspect Ratio Trapping Ge Growth," Applied Physics Letters, vol. 90, 2007, 3 pages.

Bakkers et al., "Epitaxial Growth on InP Nanowires on Germanium," Nature Materials, vol. 3, Nov. 2004, pp. 769-773.

Baron et al., "Chemical Vapor Deposition of Ge Nanocrystals on $SiO_2$," Applied Physics Letters, vol. 83, No. 7, Aug. 18, 2003, pp. 1444-1446.

Bean et al., "$Ge_xSi_{1-x}$/Si strained-later Superlattice grown by molecular beam Epitaxy," Journal of Vacuum Science Technology A2 (2), Jun. 1984, pp. 436-440.

Beckett et al., "Towards a reconfigurable nanocomputer platform," ACM International Conference Proceeding Series, vol. 19, 2002, pp. 141-150.

Beltz et al., "A Theoretical Model for Threading Dislocation Reduction During Selective Area Growth," Materials Science and Engineering, A234-236, 1997, pp. 794-797.

Belyaev, et al., "Resonance and current instabilities in AlN/GaN resonant tunneling diodes," 21 Physica E 2-4, 2004, pp. 752-755.

Berg, J., "Electrical Characterization of Silicon Nanogaps," Doktorsavhandlingar vid Chalmers Tekniska Hagskola, 2005, No. 2355, 2 pages.

Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.

Blakeslee, "The Use of Superlattices to Block the Propagation of Dislocations in Semiconductors," Mat. Res. Soc. Symposium Proceedings 148, 1989, pp. 217-227.

Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.

Borland, "Novel Device structures by selective epitaxial growth (SEG)," Electron Devices Meeting, vol. 33, 1987, pp. 12-15.

Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.

Burenkov et al., "Corner Effect in Double and Triple Gate FinFETs"European solid-state device research, 33rd Conference on Essderc '03 Sep. 16-18, 2003, Piscataway, NJ, USA, IEEE, vol. 16, pp. 135-138, XPo10676716.

Bushroa et al., "Lateral epitaxial overgrowth and reduction in defect density of 3C-SiC on patterned Si substrates," Journal of Crystal Growth, vol. 271, No. 1-2, Oct. 15, 2004, pp. 200-206.

Calado, et al., "Modeling of a resonant tunneling diode optical modulator," University of Algarve, Department of Electronics and Electrical Engineering, 2005, pp. 96-99.

Campo et al., "Comparison of Etching Processes of Silicon and Germanium in SF6-O2 Radio-Frequency Plasma," 13 Journal of Vac. Sci. Tech., B-2, pp. 235-241.

Cannon et al., "Monolithic Si-based Technology for Optical Receiver Circuits," Proceedings of SPIE, vol. 4999, 2003, pp. 145-155.

Chan et al., "Influence of Metalorganic Sources on the Composition Uniformity of Selectively Grown $Ga_xIn_{1-x}P$," Japan. Journal of Applied Physics, vol. 33, 1994, pp. 4812-4819.

Chang et al. "3-D simulation of strained Si/SiGe heterojunction FinFETs" Semiconductor Device Research Symposium, Dec. 10-12, 2003, pp. 176-177.

Chang et al., "Effect of growth temperature on epitaxial lateral overgrowth of GaAs on Si substrate," Journal of Crystal Growth, vol. 174, No. 1-4, Apr. 1997, pp. 630-634.

(56) References Cited

OTHER PUBLICATIONS

Chang et al., "Epitaxial Lateral Overgrowth of Wide Dislocation-Free GaAs on Si Substrates," Electrochemical Society Proceedings, vol. 97-21, May 13, 1998, pp. 196-200.

Chau et al., Opportunities and Challenges of III-V Nanoelectronics for Future High-Speed, Low Power Logic Applications, IEEE CSIC Digest, 2005, pp. 17-20.

Chen et al., "Dislocation reduction in GaN thin films via lateral overgrowth from trenches," Applied Physics Letters, vol. 75, No. 14, Oct. 4, 1999, pp. 2062-2063.

Chengrong, et al., "DBRTD with a high PVCR and a peak current density at room temperature," Chinese Journal of Semiconductors vol. 26, No. 10, Oct. 2005, pp. 1871-1874.

Choi et al., "Monolithic Integration GaAs/AlGaAs LED and Si Driver Circuit," 9 Electron Device Letters 10, Oct. 1988, 3 pages.

Choi et al., "Monolithic Integration of GaAs/AlGaAs Double-Heterostructure LEDs and Si MOSFETs," Electron Device Letters, vol. EDL-7, No. 9, Sep. 1986, 3 pages.

Choi et al., "Monolithic Integration of Si MOSFETs and GaAs MESFETs," Electron Device Letters, vol. EDL-7, No. 4, Apr. 1986, 3 pages.

Choi, et al., "Low-voltage low-power K-band balanced RTD-based MMIC VCO," 2006 IEEE, Department of EECS, Korea Advanced Institute of Science and Technology, 2006, pp. 743-746.

Cloutier et al., "Optical gain and stimulated emission in periodic nanopatterned crystalline silicon," Nature Materials, Nov. 2005, 5 pages.

Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.

Dadgar et al., "MOVPE growth of GaN on Si (111) substrates," Journal of Crystal Growth, vol. 248, Feb. 1, 2003, pp. 556-562.

Datta et al., "Silicon and III-V Nanoelectronics," IEEE International Conference on Indium Phosphide & Related Materials, 2005, pp. 7-8.

Datta et al., "Ultrahigh-Speed 0.5 V Supply Voltage In0.7Ga0.3As Quantum-Well Transistors on Silicon Substrate," 28 Electron Device Letters 8, 2007, pp. 685-687.

Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.

De Boeck et al., "The fabrication on a novel composite $GaAs/SiO_2$ nucleation layer on silicon for heteroepitaxial overgrowth by molecular beam Epitaxy," Material Science and Engineering, B9, 1991, pp. 137-141.

Donaton et al., "Design and Fabrication of MOSFETs with a Reverse Embedded SiGe (Rev. e-SiGe) Structure," 2006 IEDM, pp. 465-468.

Dong, Y., et al, "Selective area growth of InP through narrow openings by MOCVD and its application to InP HBT," 2003 International Conference on Indium Phosphide and Related Materials, May 12-16, 2003, pp. 389-392.

European Search Report issued by the European Patent Office on Dec. 15, 2010 in European Patent Application No. 10002884.4 (10 pages).

Examination Report in European Patent Application No. 06800414.2, mailed Mar. 5, 2009, 3 pages.

Fang et al., "Electrically pumped hybrid AlGaInAs-silicon evanescent laser," 14 Optics Express 20, 2006, pp. 9203-9210.

Feltin et al., "Epitaxial lateral overgrowth of GaN on Si (111)," Journal of Applied Physics, vol. 93, No. 1, Jan. 1, 2003, pp. 182-185.

Feng et al., "Integration of Germanium-on Insulator and Silicon Substrate," 27 Electron Device Letters 11, 2006, pp. 911-913.

Fiorenza et al., "Film Thickness Constraints for Manufacturable Strained Silicon CMOS," 19 Semiconductor Science Technology, 2004, p. L4.

Fischer et al., "Elastic stress relaxation in SiGe epilayers on patterned Si substrates," 75 Journal of Applied Physics 1, 1994, pp. 657-659.

Fischer et al., "State of stress and critical thickness of Strained small-area SiGe layers,"Phys. Stat. Sol. (a) vol. 171, 1999, pp. 475-485.

Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9, 1990, pp. 949-955.

Fitzgerald et al., "Epitaxial Necking in GaAs Growth on Pre-patterned Si Substrates," Journal of Electronic Materials, vol. 20, No. 10, 1991, pp. 839-853.

Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.

Fitzgerald et al., "Structure and recombination in InGaAs/GaAs heterostructures," 63 Journal of Applied Physics, vol. 3, 1988, pp. 693-703.

Fitzgerald et al., "Totally relaxed $Ge_xSi_{1-x}$ layers with low threading dislocation densities grown on Si Substrates," vol. 59, Applied Physics Letters 7, 1991, pp. 811-813.

Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.

Gallagher et al., "Development of the magnetic tunnel junction MRAM at IBM: From first junctions to a 16-Mb MRAM demonstrator chip," 50 IBM J. Research & Dev. 1, Jan. 2006, pp. 5-23A.

Gallas et al., "Influence of Doping on Facet Formation at the $SiO_2$/Si Interface," Surface Sci. 440, 1999, pp. 41-48.

Geppert, "Quantum transistors: toward nanoelectronics," IEEE Spectrum, Sep. 2000, pp. 46-51.

Gibbon et al., "Selective-area low-pressure MOCVD of GaInAsP and related materials on planar InP substrates," Semicond. Sci. Tech. vol. 8, 1993, pp. 998-1010.

Glew et al., "New DFB grating structure using dopant-induced refractive index step," J. Crystal Growth 261, 2004, pp. 349-354.

Golka, et al., "Negative differential resistance in dislocation-free GaN/AlGan double-barrier diodes grown on bulk GaN," 88 Applied Physics Letters 17, Apr. 2006, pp. 172106-1-172106-3.

Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.

Gould et al., "Magnetic resonant tunneling diodes as voltage-controlled spin selectors," 241 Phys. Stat. Sol. (B), vol. 3, 2004, pp. 700-703.

Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.

Gruber, et al., "Semimagnetic Resonant Tunneling Diodes for Electron Spin Manipulation," Nanostructures: Physics & Technology, 8th International Symposium, 2000, pp. 483-486.

Gustafsson et al., "Cathodoluminescence from relaxed $Ge_xSi_{1-x}$ grown by heteroepitaxial lateral overgrowth," Journal of Crystal Growth 141, 1994, pp. 363-370.

Gustafsson et al., "Investigations of high quality $Ge_xSi_{1-x}$ grown by heteroepitaxial lateral overgrowth using cathodoluminescence," Inst. Phys. Conf. Ser., No. 134, Section 11, Apr. 1993, pp. 675-678.

Hammerschmidt, "Intel to Use Trigate Transistors from 2009 on," EETIMES Online, available at: http://www.eetimes.com/showArticle.jhtml?articleID=189400035 (Jun. 12, 2006). 1 page.

Hasegawa, et al., "Sensing Terahertz Signals with III-V Quantum Nanostructures," Quantum Sensing: Evolution and Revolution from Past to Future, SPIE 2003, pp. 96-105.

Hayafuji et al., Japan, Journal of Applied Physics, vol. 29, 1990, pp. 2371.

Hersee et al., "The Controlled Growth of GaN Nanowires," Nano Letters, vol. 6, No. 8, 2006, pp. 1808-1811.

(56) References Cited

OTHER PUBLICATIONS

Hiramatsu et al., "Fabrication and characterization of low defect density GaN using facet-controlled epitaxial lateral overgrowth (FACELO)," Journal of Crystal Growth, vol. 221, Dec. 2000, pp. 316-326.
Hollander et al., "Strain and Misfit Dislocation Density in Finite Lateral Size $Si_{1-x}Ge_x$/Si Films Grown by Selective Epitaxy," Thin Solid Films, vol. 292, 1997, pp. 213-217.
Hu et al., "Growth of Well-Aligned Carbon Nanotube arrays on Silicon Substrates Using Porous Alumina Film as a Nanotemplate," 79 Applied Physics Letters 19, 2001, 3 pages.
Yanlong, et al., "Monolithically fabricated OEICs using RTD and MSM," Chinese Journal Semiconductors vol. 27, No. 4, Apr. 2006, pp. 641-645.
Huang et al., "Electron and Hole Mobility Enhancement in Strained SOI by Wafer Bonding," 49 IEEE Transactions on Electron Devices 9, 2002, pp. 1566-1570.
Ying-Long, et al., "Resonant tunneling diodes and high electron mobility transistors integrated on GaAs substrates," Chinese Physics Letters 23, vol. 3, Mar. 2006, pp. 697-700.
Hydrick et al., "Chemical Mechanical Polishing of Epitaxial Germanium on $SiO_2$-patterned Si(001) Substrates," ECS Transactions, 16 (10), 2008, (pp. 237-248).
Intel Press Release, "Intel's Tri-Gate Transistor to Enable Next Era in Energy-Efficient Performance," Intel Corporation (Jun. 12, 2006). 2 pages.
Intel to Develop Tri-Gate Transistors Based Processors, available at: http://news.techwhack.com/3822/tri-gate-transistors/ (Jun. 13, 2006) 6 pages.
International Preliminary Report on Patentability for International Application No. PCT/US2006/019152 mailed Nov. 29, 2007, 2 pages.
International Preliminary Report on Patentability for International Application No. PCT/US2006/029247 mailed Feb. 7, 2008, 12 pages.
International Preliminary Report on Patentability for International Application No. PCT/US2006/033859 mailed Mar. 20, 2008, 14 pages.
International Preliminary Report on Patentability for International Application No. PCT/US2007/019568 mailed Mar. 19, 2009, 10 pages.
International Preliminary Report on Patentability for International Application No. PCT/US2007/020181 mailed Apr. 2, 2009, 9 pages.
International Preliminary Report on Patentability for International Application No. PCT/US2007/020777 mailed Apr. 9, 2009, 12 pages.
International Preliminary Report on Patentability for International Application No. PCT/US2007/021023 mailed Apr. 9, 2009, 8 pages.
International Preliminary Report on Patentability for International Application No. PCT/US2007/022392 mailed Apr. 30, 2009, 14 pages.
International Search Report and Written Opinion for International Application No. PCT/US2006/019152 mailed Oct. 19, 2006, 11 pages.
International Search Report and Written Opinion for International Application No. PCT/US2006/029247 mailed May 7, 2007, 19 pages.
International Search Report and Written Opinion for International Application No. PCT/US2008/068377, mailed Jul. 6, 2009, 19 pages.
International Search Report and Written Opinion for International Application No. PCT/US2006/033859 mailed Sep. 12, 2007, 22 pages.
International Search Report and Written Opinion for International Application No. PCT/US2007/007373, dated Oct. 5, 2007, 13 pages.
International Search Report and Written Opinion for International Application No. PCT/US2007/019568 mailed Feb. 6, 2008, 13 pages.
International Search Report and Written Opinion for International Application No. PCT/US2007/020181 mailed Jan. 25, 2008, 15 pages.
International Search Report and Written Opinion for International Application No. PCT/US2007/020777 mailed Feb. 8, 2008, 18 pages.
International Search Report and Written Opinion for International Application No. PCT/US2007/021023 mailed Jun. 6, 2008, 10 pages.
International Search Report and Written Opinion for International Application No. PCT/US2007/022392 mailed Apr. 11, 2008, 20 pages.
International Search Report for International Application No. PCT/US2006/019152, mailed May 17, 2005. 11 pages.
International Technology Roadmap for Semiconductors—Front End Processes, pp. 1-62 (2005).
Ipri et al., "MONO/POLY technology for fabricating low-capacitance CMOS integrated circuits," Electron Devices, IEEE Transactions, vol. 35, No. 8, Aug. 1988 pp. 1382-1383.
Ishibashi, et al., "3rd Topical Workshop on Heterostructure Microelectronics for Information Systems Applications," Aug.-Sep. 1998, 115 pages.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.
Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Depostion of $Si_{1-x}Ge_x$," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.
Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.
Kim et al., "Silicon-Based Field-Induced Band-to-Band Tunneling Effect Transistor," IEEE Electron Device Letters, No. 25, No. 6, 2004, pp. 439-441.
Kim et al., "GaN nano epitaxial lateral overgrowth on holographically patterned substrates," School of Physics and Inter-University Semiconductor Research Center, Seoul National University, Aug. 25-27, 2003, pp. 27-28.
Kimura et al., "Vibronic Fine Structure Found in the Blue Luminescence from Silicon Nanocolloids," Japan, Journal of Applied Physics, vol. 38, 1999, pp. 609-612.
Klapper, "Generation and Propagation of Dislocations During Crystal Growth," Mat. Chem. and Phys. vol. 66, 2000, pp. 101-109.

(56) References Cited

OTHER PUBLICATIONS

Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.

Kollonitsch, et al., "Improved Structure and Performance of the GaAsSb/InP Interface in a Resonant Tunneling Diode," Journal of Crystal Growth, vol. 287, 2006, pp. 536-540.

Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9.

Krost et al., "GaN-based Optoelectronics on Silicon Substrates," Materials Science & Engineering, B93, 2002, pp. 77-84.

Sudirgo et al., "Si-Based Resonant Interband Tunnel Diode/CMOS Integrated Memory Circuits," Rochester Institute of Technology, IEEE, 2006, pp. 109-112.

Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.

Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.

Kwok, "Barrier-Injection Transit Time Diode," Complete Guide to Semiconductor Devices, $2^{nd}$ ed., Chapter 18, 2002, pp. 137-144.

Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.

Langdo et al., "High Quality Ge on Si by Epitaxial Necking," Applied Physics Letters, vol. 76, No. 25, Jun. 19, 2000, pp. 3700-3702.

Langdo, "Selective SiGe Nanostructures," PhD Thesis, Massachusetts Institute of Technology, Jun. 2001, 215 pages.

Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.

Lee et al., "Strain-relieved, Dislocation-free $In_xGa_{1-x}As/GaAs(001)$ Hetrostructure by Nanoscale-patterned Growth," Applied Physics Letters, vol. 85, No. 18, Nov. 1, 2004, pp. 4181-4183.

Li et al., "Defect Reduction of GasAs Epitaxy on Si (001) Using Selective Aspect Ratio Trapping," 91 Applied Physics Letters, 2007, pp. 021114-1-021114-3.

Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.

Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.

Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.

Li et al., "Selective Growth of Ge on Si (100) through Vias of $Si_{o2}$ Nanotemplate Using Solid Source Molecular Beam Epitaxy," Applied Physics Letters, vol. 83, No. 24, Dec. 15, 2003, pp. 5032-5034.

Liang et al., "Critical Thickness enhancement of Epitaxial SiGe films Grown on Small Structures," Journal of Applied Physics, vol. 97, 2005, pp. 043519-1-043519-7.

Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.

Liu et al., "High Quality Single-crystal Ge on Insulator by Liquid-phase Epitaxy on Si Substrates," Applied Physics Letters, vol. 84, No. 14, April. 4, 2004, pp. 2563-2565.

Liu et al., "Rapid Melt Growth of Germanium Crystals with Self Aligned Microcrucibles on Si Substrates," Journal of the Electrochemical Society, vol. 152, No. 8, 2005, pp. G688-G693.

Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.

Lourdudoss et al., "Semi-insulating epitaxial layers for optoelectronic devices," Semiconducting and Insulating Materials Conference, SIMC-XI, 2000, pp. 171-178.

Luan et al., "High-quality Ge Epilayers on Si with Low Threading-dislocation Densities," Applied Physics Letters, vol. 75, No. 19, Nov. 8, 1999, pp. 2909-2911.

Luan, "Ge Photodetectors for Si Microphotonics," PhD Thesis, Massachusetts Institute of Technology, Department of Materials Science & Engineering, Jan. 12, 2001, 155 pages.

Lubnow et al., "Effect of III/V-Compound Epitaxy on Si Metal-Oxide-Semiconductor Circuits," Japan, Journal of Applied Physics, vol. 33, 1994, pp. 3628-3634.

Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.

Luryi et al., "New Approach to the High Quality Epitaxial Growth of Latticed-Mismatched Materials," Applied Physics Letters, vol. 39, No. 3, Jul. 21, 1986, pp. 140-142.

Ma, et al., "A small signal equivalent circuit model for resonant tunneling diode," Chinese Physics Letters, vol. 23, No. 8, Aug. 2006, pp. 2292-2295.

Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.

Maekawa, et al., "High PVCR Si/Si1–x/Gex DW RTD formed with a new triple-layer buffer," Materials Science in Semiconductor Processing, vol. 8, 2005, pp. 417-421.

Maezawa, et al., "Metamorphic resonant tunneling diodes and its application to chaos generator ICs, "44 Jap. J. Applied Physics, Part 1, No. 7A, Jul. 2005, pp. 4790-4794.

Maezawa, et al., "InP-based resonant tunneling diode/HEMT integrated circuits for ultrahigh-speed operation," IEEE Nagoya University, Institute for Advanced Research, 2006, pp. 252-257.

Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.

Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.

Matthews et al., "Defects in Epitaxial Multilayers—Misfit Dislocations," Journal of Crystal Growth, vol. 27, 1974, pp. 118-125.

Monroy, et al., "High UV/visible Contrast Photodiodes Based on Epitaxial Lateral Overgrown GaN layers," Electronics Letters, vol. 35, No. 17, Aug. 19, 1999, pp. 1488-1489.

Nakano et al., "Epitaxial Lateral Overgrowth of AlN Layers on Patterned Sapphire Substrates," Source: Physica Status Solidi A, vol. 203, No. 7, May 2006, pp. 1632-1635.

Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.

Naoi et al., "Epitaxial Lateral Overgrowth of GaN on Selected-area Si (111) Substrate with Nitrided Si Mask," Journal of Crystal Growth, vol. 248, 2003, pp. 573-577.

Naritsuka et al., "InP Layer Grown on (001) Silicon Substrate by Epitaxial Lateral Overgrowth," Japan, Journal of Applied Physics, vol. 34, 1995, pp. L1432-L1435.

Naritsuka et al., "Vertical Cavity Surface Emitting Laser Fabricated on GaAs Laterally Grown on Si Substrate," Electrochemical Society Proceedings, vol. 97, No. 21, pp. 86-90.

Neudeck, et al., "Novel silicon Epitaxy for advanced MOSFET devices," Electron Devices Meeting, IEDM Technical Digest International, 2000, pp. 169-172.

(56) References Cited

OTHER PUBLICATIONS

Neumann et al., "Growth of III-V Resonant Tunneling Diode on Si Substrate with LP-MOVPE," Journal of Crystal Growth, vol. 248, 2003, pp. 380-383.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.
Noda, et al., "Current-voltage characteristics in double-barrier resonant tunneling diodes with embedded GaAs quantum rings," Physica E 32, 2006, pp. 550-553.
Norman, et al., "Characterization of MOCVD Lateral Epitaxial Overgrown III-V Semiconductor Layers on GaAs Substrates," Compound Semiconductors, Aug. 25-27, 2003, pp. 45-46.
Notification of Transmittal of the International Search Report and the Written Opinion of the International Searching Authority for PCT/US2010/029552, Applicant: Taiwan Semiconductor Manufacturing Company, Ltd., May 26, 2010, 14 pages.
Oehrlein et al., "Studies of the Reactive Ion Etching of SiGe Alloys," J. Vac. Sci. Tech, A9, No. 3, May/Jun. 1991, pp. 768-774.
Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.
Parillaud et al., "High Quality InP on Si by Conformal Growth," Applied Physics Letters, vol. 68, No. 19, May 6, 1996, pp. 2654-2656.
Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.
Park et al., "Defect Reduction of Selective Ge Epitaxy in Trenches on Si (001) Substrates Using Aspect Ratio Trapping," Applied Physics Letters 90, 052113, Feb. 2, 2007, 3 pages.
Park et al., "Fabrication of Low-Defectivity, Compressively Strained Geon $Si_{0.2}G^e{}_{0.8}$ Structures Using Aspect Ratio Trapping," Journal of The Electrochemical Society, vol. 156, No. 4, 2009, pp. H249-H254.
Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.
Partial International Search for International Application No. PCT/US2006/033859 mailed Jun. 22, 2007, 7 pages.
Partial International Search Report for International Application No. PCT/US2008/004564 completed Jul. 22, 2009, mailed Oct. 16, 2009, 5 pages.
Partial International Search Report for International Application No. PCT/US2008/068377, completed Mar. 19, 2008, mailed Apr. 22, 2008, 3 pages.
PCT International Search Report of PCT/US2009/057493, from PCT/ISA/210, mailed Mar. 22, 2010, Applicant: Amberwave System Corporation et al., 2 pages.
Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: 27th International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-111901-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pae, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., Promise of Tunnel Diode Integrated Circuits, Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical—Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters 9, Sep. 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Int'l SOI Conf., pp. 110-111.
Suhara, et al, "Characterization of argon fast atom beam source and its application to the fabrication of resonant tunneling diodes," 2005 International Microprocesses and Nanotechnology Conf. Di. Of Papers, 2005, pp. 132-133.
Sun et al., Electron resonant tunneling through InAs/GaAs quantum dots embedded in a Schottky diode with an AlAs insertion layer, 153 J. Electrochemical Society 153, 2006, pp. G703-G706.
Sun et al., "Room-temperature observation of electron resonant tunneling through InAs/AlAs quantum dots," 9 Electrochemical and Solid-State Letters 5, May 2006, pp. G167-G170.

(56) References Cited

OTHER PUBLICATIONS

Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.
Sun et al., "Selective Area Growth of InP on InP Precoated Silicon Substrate by Hydride Vapor Phase epitaxy," Indium Phosphide and Related Materials Conference, IPRM. 14$^{th}$, 2002, pp. 339-342.
Sun et al., "Sulfur Doped Indium Phosphide on Silicon Substrate Grown by Epitaxial Lateral Overgrowth," Indium Phosphide and Related Materials 16$^{th}$ IPRM, May 31-Jun. 4, 2004, pp. 334-337.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "Thermal Strain in Indium Phosphide on Silicon Obtained by Epitaxial Lateral Overgrowth," 94 Journal of Applied Physics 4, 2003, pp. 2746-2748.
Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.
Suzuki, et al., "Mutual injection locking between sub-THz oscillating resonant tunneling diodes," Japan Science and Technology Agency, IEEE, Joint 30$^{th}$ International Conference on Infrared and Millimeter Waves & 13$^{th}$International Conference on Terahertz Electronics, 2005, pp. 150-151.
Takasuka et al., "AlGaAs/InGaAs DFB Laser by One-Time Selective MOCVD Growth on a Grating Substrate," 43 Japan, Journal of Applied Physics, 4B, 2004, pp. 2019-2022.
Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-patterned GaAs on Si," Journal of Crystal Growth, vol. 147, 1995, pp. 264-273.
Tanaka et al., "Structural Characterization of GaN Lateral Overgrown on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulator (SC-SSOI) PMOS with Different Channel Orientations," IEEE, 2005, pp. 1-4.
Thelander, et al., "Heterostructures incorporated in one-dimensional semiconductor materials and devices," Physics of Semiconductors, vol. 171, 2002, 1 page. Abstract Only.
Thompson et al., "A Logic Nanotechnology Featuring Strained-Silicon," 25 IEEE Electron Device Letters 4, 2004, pp. 191-193.
Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp. 1277-1286.
Tomiya, "Dependency of crystallographic tilt and defect distribution of mask material in epitaxial lateral overgrown GaN layers," Applied Physics Letters vol. 77, No. 5, pp. 636-638.
Tran et al., "Growth and Characterization of InP on Silicon by MOCVD," Journal of Crystal Growth, vol. 121, 1992, pp. 365-372.
Tsai, et al., "InP/InGaAs resonant tunneling diode with six-route negative differential resistances," 13th European Gallium Arsenide and other Compound Semiconductors Application Symp., 2006, pp. 421-423.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.

Tseng et al., "Effects of Isolation Materials on Facet Formation for Silicon Selective Epitaxial Growth," 71 Applied Physics Letters 16, 1997, pp. 2328.
Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.
Ujiie, et al., Epitaxial Lateral Overgrowth of GaAs on a Si Substrate, 28, Japan, Journal of Applied Physics, vol. 3, Mar. 1989, pp. L337-L339.
Usuda et al., "Strain Relaxation of Strained-Si Layers on SiGe-on-Insulator (SGOI) Structures After Mesa Isolation," Applied Surface Science, vol. 224, 2004, pp. 113-116.
Usui et al., "Thick GaN Epitaxial Growth with Low Dislocation Density by Hydride Vapor Phase Epitaxy," vol. 36, Japan, Journal of Applied Physics, 1997, pp. L899-L902.
Vanamu et al., "Epitaxial Growth of High-Quality Ge Films on Nanostructured Silicon Substrates," Applied Physics Letters, vol. 88, 2006, pp. 204104.1-204.104.3.
Vanamu et al., "Growth of High Quality Ge/Si$_{1-x}$Ge$_x$ on Nano-scale Patterned Si Structures," J. Vac. Sci. Technology. B, vol. 23, No. 4, Jul./Aug. 2005, pp. 1622-1629.
Vanamu et al., "Heteroepitaxial Growth on Microscale Patterned Silicon Structures," Journal of Crystal Growth, vol. 280, 2005, pp. 66-74.
Vanamu et al., "Improving Ge Si$_x$Ge$_{1-x}$ Film Quality through Growth onto Patterned Silicon Substrates," Advances in Electronics Manufacturing Technology, Nov. 8, 2004, pp. 1-4.
Vescan et al., "Lateral Confinement by Low Pressure Chemical Vapor Deposition-Based Selective Epitaxial Growth of. Si$_{1-x}$Ge$_x$/Si Nanostructures," No. 81, Journal of Applied Physics 10, 1997, pp. 6709-6715.
Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.
Walker, et al., "Magnetotunneling spectroscopy of ring-shaped (InGa)As quantum dots: Evidence of excited states with 2pz character," 32 Physica E 1-2, May 2006, pp. 57-60.
Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.
Ting, et al., "Modeling Spin-Dependent Transport in InAS/GaSb/AlSb Resonant Tunneling Structures," 1 J. Computational Electronics, 2002, pp. 147-151.
Watanabe, et al., "Fluoride resonant tunneling diodes on Si substrates," IEEE International Semiconductor Device Research Symp. Dec. 2005, pp. 177-178.
Wernersson et al., "InAs Epitaxial Lateral Growth of W Marks," Journal of Crystal Growth, vol. 280, 2005, pp. 81-86.
Williams et al., "Etch Rates for Micromachining Processing—Part II," Journal of Microelectromechanical Systems, vol. 4, 1996, pp. 761-778.
Williams et al., "Etch Rates for Micromachining Processing—Part II," Journal of Microelectromechnical Systems, vol. 5, No. 4, Dec. 1996, pp. 256-269.
Wu et al., "Enhancement-mode InP n-channel metal-oxide-semiconductor field-effect-transistors with atomic-layer-deposited Al2O3 dielectrics," Applied Physics Letters 91, 022108-022110 (2007).
Wu et al., Gross-Sectional Scanning/Tunneling Microscopy Investigations of Cleaned III-V Heterostructures, Technical report, Dec. 1996, 7 pages.
Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.
Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-161105-3.

(56) References Cited

OTHER PUBLICATIONS

Xie et al., "From Porous Si to Patterned Si Substrate: Can Misfit Strain Energy in a Continuous Heteropitaxial Film Be Reduced?" Journal of Vacuum Science Technology, B, vol. 8, No. 2, Mar./Apr. 1990, pp. 227-231.
Xu et al., "Spin-Filter Devices Based on Resonant Tunneling Antisymmetrical Magnetic Semiconductor Hybrid Structures," vol. 84, Applied Physics Letters 11, 2004, pp. 1955-1957.
Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.
Yamaguchi et al., "Defect Reduction Effects in GaAs on Si Substrates by Thermal Annealing," Applied Physics Letters vol. 53, No. 23, 1998, pp. 2293.
Yamaguchi et al., GaAs Solar Cells Grown on Si Substrates for Space Use: Prog. Photovolt.: Res. Appl., vol. 9, 2001; pp. 191-201.
Yamaguchi et al., "Super-High-Efficiency Multi-junction Solar Cells," Prog. Photovolt.: Res. Appl., vol. 13, 2005, pp. 125-132.
Yamamoto et al., "Optimization of InP/Si Heteroepitaxial Growth Conditions Using Organometallic Vapor Phase Epitaxy," Journal of Crystal Growth, vol. 96, 1989, pp. 369-377.
Yang et al., "High Performance CMOS Fabricated on Hybrid Substrate with Different Crystal Orientations," IEDM Tech. Dig., 2003, pp. 453-456.
Yang et al., "Selective Area Deposited Blue GaN-InGaN Multiple-quantum Well Light Emitting Diodes over Silicon Substrates," Applied Physics Letter, vol. 76, No. 3, Jan. 17, 2000, pp. 273-275.
Yili, et al., "Physics-based hydrodynamic simulation of direct current characteristics in DBRTD," 29 Chinese J. Electron. Devices 2, Jun. 2006, pp. 365-368.
Yin et al., "Ultrathin Strained-SOI by Stress Balance on Compliant Substrates and FET Performance," 52 IEEE Trans. On Electron Devices 10, 2005, pp. 2207-2214.
Dong et al., "Selective area growth of InP through narrow openings by MOCVD and its application to inP HBT," Indium Phosphide and Related Materials, International Conference, May 12-16, 2003, pp. 389-392.
Yoon et al., "Selective Growth of Ge Islands on Nanometer-scale Patterned $SiO_2$/Si Substrate by Molecular Beam Epitaxy," Applied Physics Letters, vol. 89, 2006, pp. 063107.1-063107.3.
Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.
Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.
Zang et al., "Nanoheteroepitaxial lateral overgrowth of GaN on nanoporous Si (111)," Applied Physics Letters, vol. 88, No. 14, Apr. 3, 2006, pp. 141925.
Zang et al., "Nanoscale lateral epitaxial overgrowth of GaN on Si (111)," Applied Physics Letters, vol. 87, No. 19 (Nov. 7, 2005) pp. 193106.1-193106.3.
Zela et al., "Single-crystalline Ge Grown Epitaxially on Oxidized and Reduced Ge/Si (100) Islands," Journal of Crystal Growth, vol. 263, 2004, pp. 90-93.
Zhang et al., "Removal of Threading Dislocations from Patterned Heteroepitaxial Semiconductors by Glide to Sidewalls," Journal of Electronic Materials, vol. 27, No. 11, 1998, pp. 1248-1253.
Zhang et al., "Strain Status of Self-Assembled InAs Quantum Dots," Applied Physics Letters, vol. 77, No. 9, Aug. 28, 2000, pp. 1295-1297.
Zheleva et al., "Lateral Epitaxy and Dislocation Density Reduction in Selectively Grown GaN Structures," Journal of Crystal Growth, vol. 222, No. 4, Feb. 4, 2001, pp. 706-718.
Zubia et al., "Initial Nanoheteroepitaxial Growth of GaAs on Si (100) by OMVPE," Journal of Electronic Materials, vol. 30, No. 7, 2001, pp. 812-816.
European Patent Office, Extended European Search Report and Search Opinion dated Jan. 26, 2011 in EP Patent Application No. 10003084.0-2203 (9 pages).

\* cited by examiner

METHODS FOR SEMICONDUCTOR SENSOR STRUCTURES WITH REDUCED DISLOCATION DEFECT DENSITIES

CROSS-REFERENCE TO RELATED APPLICATIONS

The present application is a continuation of U.S. patent application Ser. No. 14/333,204, filed on Jul. 16, 2014, entitled "SEMICONDUCTOR SENSOR STRUCTURES WITH REDUCED DISLOCATION DEFECT DENSITIES," which is a continuation of U.S. patent application Ser. No. 13/594,519, filed Aug. 24, 2012, entitled "METHOD FOR SEMICONDUCTOR SENSOR STRUCTURES WITH REDUCED DISLOCATION DEFECT DENSITIES," which is a divisional of U.S. patent application Ser. No. 12/565,863, filed Sep. 24, 2009, entitled "SEMICONDUCTOR SENSOR STRUCTURES WITH REDUCED DISLOCATION DEFECT DENSITIES," which claims priority from U.S. Provisional Patent application Ser. No. 61/099,902, filed Sep. 24, 2008, entitled "Improved Semiconductor Sensor Structures with Reduced Dislocation Defect Densities and Related Methods for the Same;" the above applications are incorporated by reference herein in their entireties and for which benefit of the priority dates is hereby claimed.

TECHNICAL FIELD OF THE DISCLOSURE

The technical field of this disclosure relates to the art of semiconductor devices; and more particularly to the art of methods of making semiconductor devices using aspect-ratio-trapping techniques and semiconductor devices made thereof.

BACKGROUND OF THE DISCLOSURE

There is a constant drive within the semiconductor industry to increase the performance and reduce the cost of semiconductor devices, such as photodetectors, diodes, light-emitting diodes, transistors, latches, and many other semiconductor devices. This drive has resulted in continual demands for integrating one type of semiconductor devices into another semiconductor process.

For example in photodetectors that are comprised of an array of p-n junctions or pi-n structures, it is advantages to make the p-n junctions and/or p-i-n structures with low band-gap materials, such as germanium (Ge) and InGaAs, because the photodetectors are able to detect infrared light. In favor of the cost-efficiency, it is desired to produce a thin film of III-V or other non-silicon materials on low-cost large-size silicon wafers to reduce the cost of high performance III-V devices. It is further desired to integrate non-siliconp-n junctions and/or p-i-n structures (e.g. Ge or InGaAs based) into a silicon process such that other circuitry in a system, such as a photodetector, can be fabricated using a standard silicon process, such as a standard CMOS (complementary-metal-oxide-semiconductor) process. It is also desirable to fabricate the non-silicon devices and silicon CMOS in a co-planar manner, so that the interconnection and integration of the whole system can be conducted in a manner compatible with standard and low-cost CMOS process. Further, it is desirable to increase a size of non-silicon regions configured to output electrons generated by light absorption therein.

BRIEF DESCRIPTION OF DRAWINGS

FIG. 19b diagrammatically illustrates a top view of a portion of the photodetectors in FIG. 19a;

FIG. 20b diagrammatically illustrates a top view of a portion of the photodetectors in FIG. 20a;

DETAILED DESCRIPTION OF SELECTED EXAMPLES

Figure 1A:
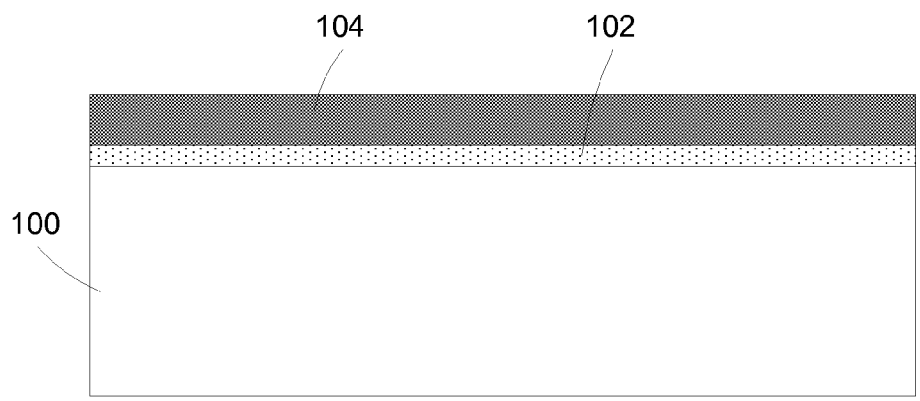
FIG. 1a diagrammatically illustrates a first step of an exemplary method of making a semiconductor device.

Disclosed herein is a method of making semiconductor devices and semiconductor devices made thereof.

The method enables integration of non-silicon semiconductor devices into a silicon process such that silicon circuitry of the semiconductor device can be formed through standard silicon processes. This integration capability can be of great importance in using low band-width or high band-width semiconductor materials for making a semiconductor device having p-n and p-i-n structures in silicon processes.

The method also enables forming ART (aspect-ratio-trapping) crystalline structures in a trench structure, such as a trench structure patterned by a trench patterning-process (e.g. a standard complementary-metal-oxide-semiconductor (CMOS) STI (shallow-trench-insulation) process) or a STI-like trench patterned structure. The semiconductor devices formed at or in the ART structure(s) can have any desired lateral and/or vertical dimensions that are substantially free from the aspect-ratio requirements or process limitations in most current ART techniques. For demonstration and simplicity purposes, the method will be discussed with reference to selected examples wherein ART crystalline structures are formed on STI process trench structures in some of the examples. It will be appreciated by those skilled in the art that the exemplary methods as discussed in the following can also be implemented to form ART structures on other types of trenches.

Aspect Ratio Trapping (ART) is a defect reduction and heteroepitaxy growth technique. As used herein, "ART" or "aspect ratio trapping" refers generally to the technique(s) of causing defects to terminate at non-crystalline, e.g., dielectric sidewalls during heteroepitaxy growth, where the sidewalls are sufficiently high relative to the size of the growth area so as to trap most, if not all, of the defects. ART utilizes high aspect ratio openings, such as trenches or holes, to trap dislocations, preventing them from reaching the epitaxial film surface, and greatly reduces the surface dislocation density within the ART opening. Further details of example ART devices and ART techniques in which this invention is described are in U.S. patent application Ser. No. 11/436,198 filed May 17, 2006; Ser. No. 11/493,365 filed Jul. 26, 2006; and Ser. No. 11/852,078 filed Sep. 7, 2007, all of which are hereby incorporated by reference.

Furthermore, with customized ART growth parameters, an enhanced lateral epitaxy overgrowth (ELO) mode may be realized for expanded epitaxy beyond the trenched region, e.g., regions with openings formed therein, which yields bulky "free-standing" high quality materials centered above the initial trenched seed layer. Therefore, a combined ART and ELO technology greatly increases the quality and applicable film surface area of lattice-mismatched materials on substrates such as Si substrates. The relatively simple process enables reliable and reproducible results.

The method further enables forming a large-scale ART structure in the presence of STI process trenches, which in turn enables forming a semiconductor device or an element of a semiconductor device with desired lateral or vertical dimension. In particular, a large-scale intrinsic semiconductor region can be formed in the large-scale ART structure.

The method enables forming a semiconductor device or an element of a semiconductor device on a buffer layer disposed on a semiconductor crystalline substrate, whereas the buffer layer can be graded. The buffer layer can be disposed within an opening formed in a dielectric layer or can be disposed in a trench formed in a crystalline substrate.

The method also enables forming anisotropic or isotropic ELO (epitaxial-lateral-overgrown) regions, at or in which a semiconductor element or a semiconductor device can be formed.

The method also enables forming semiconductor devices or elements of semiconductor devices in coalesced regions between adjacent ART structures.

The method also enables forming lateral p-n and p-i-n structures of semiconductor devices at or in an ART structure.

In a particular implementation, the method is capable of being used for making a semiconductor device having complementary-metal-oxide-semiconductor device with a photodetector that is formed at or in an ART structure. Other non-silicon or silicon based circuitry can also be formed along with the photodetector.

The method and semiconductor devices made thereof will be discussed in the following with selected examples. It will be appreciated by those skilled in the art that the following discussion is for demonstration purposes and should not be interpreted as a limitation. Other variations within the scope of this disclosure are also applicable.

Referring to the drawings, FIG. 1a through FIG. 1d diagrammatically illustrate an exemplary method of making an epitaxial structure using an aspect-ratio-trapping (ART) technique. Referring to FIG. 1 a, substrate 100 is provided, which can be a semiconductor crystalline substrate, such as a silicon substrate. Dielectric layer 102 comprised of a dielectric material is deposited on substrate 100. The dielectric material can be any suitable materials, which is preferably, though not required, an oxide or nitride of a semiconductor element, such as SiO, and $SiN_x$. Other materials are also applicable, such as an oxide or nitride of a metal element, a metal alloy, or a ceramic material.

Screen layer 104 is deposited on dielectric layer 102. The screen layer is comprised of a material that is highly selective to the etching process to be used for etching substrate 100. For example, screen layer 104 can be comprised of $TiN_x$ when a dry etching process is to be performed for forming trenches in substrate 100.

Figure 1B:
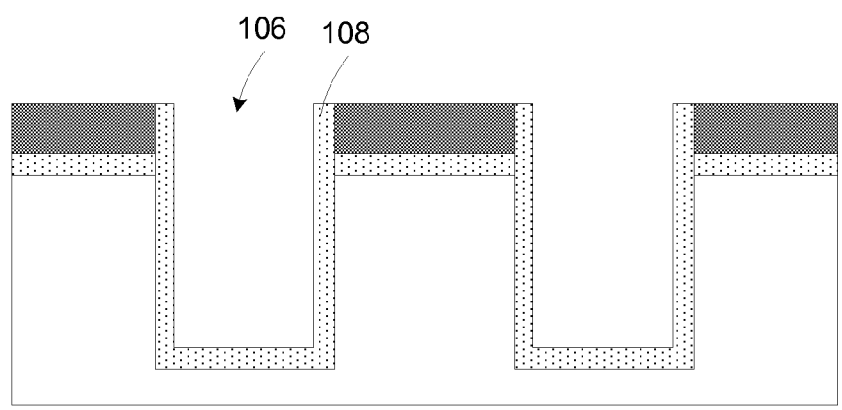
FIG. 1b diagrammatically illustrates a second step of the exemplary method of making the semiconductor device.

The substrate 100 can be etched by a selected etching process so as to form openings, such as opening 106 in FIG. 1b. Due to the selectivity of the screen layer 104 to the etching process, the trench (e.g. 106) in the substrate 100 can have a larger depth or width while still maintaining the desired aspect ratio for the following ART growth. In one example, the opening 106 can have a depth of 100 nanometers or larger, 200 nanometers or larger, 500 nanometers or larger, 1 micron or larger, such as 1.5 micron or larger, 2 microns or larger, 3 microns or larger, or 5 microns or larger. The opening 106 may have a width of 20 nanometers or larger, 100 nanometers or larger, 500 nanometers or larger, 1 micron or larger, such as 1.5 micron or larger, 2 microns or larger, 3 microns or larger, or 5 microns or larger. The aspect ratio of the opening 106 can be 0.5 or higher, such as 1 or higher, 1.5 or higher.

The opening can then be filled with a selected dielectric material so as to coat the sidewalls 108 of the opening for the following ART growth in the opening. In one example, dielectric layer 108 at the sidewalls of the opening can be comprised of an oxide (e.g. $SiO_x$), a nitride, (e.g. $TiN_x$), or other suitable materials. In another example, the dielectric layer 108 at the sidewall of the opening can be comprised of $TiN_x$ or a material having a free-surface energy substantially equal to or higher than that of $TiN_x$.

Figure 1C:
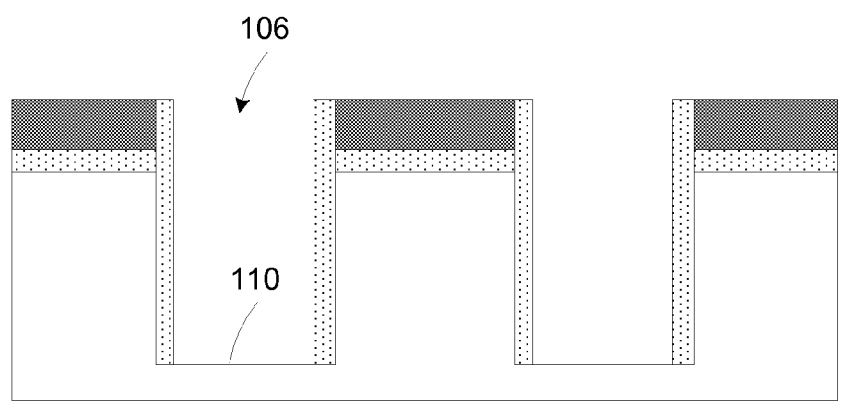
FIG. 1c diagrammatically illustrates a third step of the exemplary method of making the semiconductor device.

After coating the sidewalls of the opening 106, the dielectric layer can be etched so as to remove the dielectric material at the bottom portion 110 of the opening for exposing the underneath substrate 100, as diagrammatically illustrated in FIG. 1c.

Figure 1D:
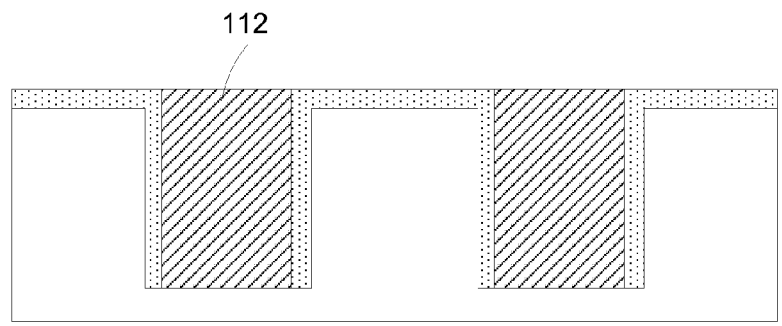
FIG. 1d diagrammatically illustrates a fourth step of the exemplary method of making the semiconductor device.

In the formed opening 106 as shown in FIG. 1c, an ART process can be performed so as to form epitaxial material 112 as diagrammatically illustrated in FIG. 1d. Exemplary methods for ART processes are set forth in U.S. patent application Ser. No. 11/436,198 filed May 17, 2006; Ser. No. 11/493,365 filed Jul. 26, 2006; and Ser. No. 11/852,078 filed Sep. 7, 2007, all of which are hereby incorporated by reference in entirety. The ART structure is comprised of a semiconductor material. For example, the ART structure may be comprised of a group IV element or compound, a III-V or III-N compound, or a II-VI compound. Examples of group IV elements include Ge and Si; and examples of group IV compounds include SiGe (examples of III-V compounds include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), indium antimonide (InSb), and their ternary and quaternary compounds. Examples of III-N compounds include aluminum nitride (AlN), gallium nitride (GaN), indium nitride (InN), and their ternary and quaternary compounds. Examples of II-VI compounds includes zinc selenide (ZnSe), zinc telluride (ZnTe), cadmium selenide (CdSe), cadmium telluride (CdTe), zinc sulfide (ZnS), and their ternary and quaternary compounds.

The above method of forming ART epitaxial structures and the epitaxial ART structures made thereof have many advantages. For example wherein the substrate is a silicon substrate, a non-silicon crystalline material, such as germanium or other semiconductor materials, can be formed in the trench of the substrate. As a consequence, a non-silicon semiconductor device can be formed at or in the non-silicon crystalline ART material, such as a germanium based p-n or p-i-n structure. Other silicon circuitry of the semiconductor device can thus be formed in or at the silicon substrate using standard silicon processes, an example of which will be described afterwards with reference to FIG. 5.

In another example, the above method enables photodetector pixels to be integrated into a silicon process. A photodetector pixel comprises a p-n or p-i-n structure and associated circuitry, such as signal converting circuits. In some applications, it is desired to make the p-n or p-i-n structure using a low band-gap material, such as Ge, InGaAs, SiGe, and InP for detecting infrared light. In some other examples, a p-n junction made from a high band-gap semiconductor material, such as GaN and InP, is desired for detecting ultra-violet light. The non-silicon semiconductor elements (e.g. the p-n junction or p-i-n structure) can be formed at or in the ART epitaxial structure comprised of the non-silicon semiconductor material, such as Ge and InGaAs.

Other circuitry of the photodetector can be formed by using standard silicon processes, such as a standard CMOS process. When the photodetector is desired to have a size larger than a critical threshold, such as equal to or larger than 2 microns, or from 2 to 5 microns, an opening in the silicon substrate can be made to have a width equal to or larger than the desired size of the photodetector, such as equal to or larger than 2 microns, or from 2 to 5 microns. The ART epitaxial crystalline structure formed in the opening can thus have a width equal to or larger than the desired size of the photodetector. Further, desired A/R can simultaneously be maintained.

Figure 2:
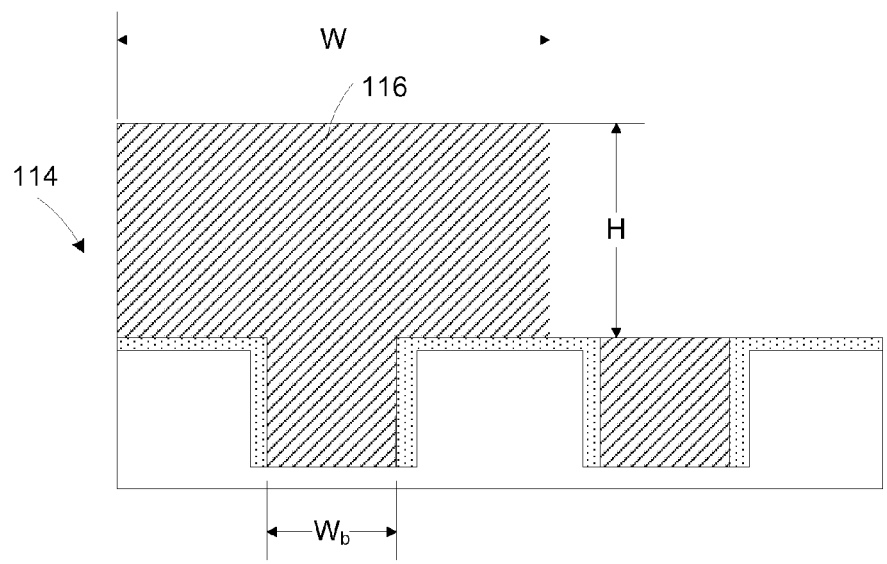
FIG. 2 diagrammatically illustrates a cross-sectional view of an exemplary structure having an epitaxial-lateral-over-growth at or in which a semiconductor device can be fabricated.

In addition to forming an ART epitaxial crystalline structure within a wide opening in a substrate, an ART with a large dimension can alternatively be obtained through overgrowing, as diagrammatically illustrated in FIG. 2. Referring to FIG. 2, an opening can have a width $W_b$ formed in a substrate using, for example a STI technique. By overgrowing the ART crystalline structure 114 within the opening, an overgrown crystalline portion 116 can be obtained. The overgrown crystalline portion 116 can have a height H that is 1.5 times or more, 2 times or more, 5 times or more, 10 times or more, or from 5 to 10 times of the height of the opening formed in the substrate. The overgrown crystalline portion 116 can have a width W that is 1.5 times or more, 2 times or more, 5 times or more, 10 times or more, or from 5 to 10 times of the width $W_b$ of the opening formed in the substrate.

The large lateral dimension of the overgrown portion 116 can also be obtained from ELO (epitaxial-lateral-overgrowth). The ELO can be isotropic or anisotropic. For obtaining a flat surface of the overgrown portion 116, a CMP (chemical mechanical polishing) process can be performed. The overgrown portion 116 can further be patterned so as to obtain desired dimensions (lateral and vertical dimensions and/or the shape) using for example, a photolithography process.

A semiconductor device or an element of a semiconductor device having a large size (e.g. equal to or larger than 2 microns) can then be formed in the overgrown crystalline portion 116. For example, a p-n or p-i-n structure with a size of 100 nanometers or more, 500 nanometers or more, 1 micron or more, 2 microns or more, 5 microns or more, or 10 microns or more, or from 5 to 10 microns can be formed at or in the overgrown crystalline portion 116.

Figure 3:
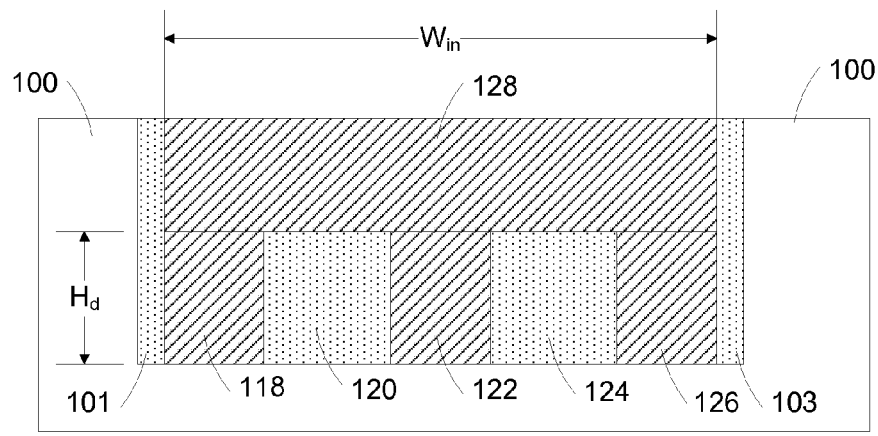
FIG. 3 diagrammatically illustrates a cross-sectional view of an exemplary structure having a large lateral intrinsic region.

Large ART crystalline structures can alternatively be obtained by forming the ART crystalline structure within a large trench formed in a substrate, as diagrammatically demonstrated in FIG. 3. Referring to FIG. 3, an opening with a large width, such as 100 nanometers or larger, 500 nanometers or larger, 1 micron or larger, 2 microns or larger, 5 microns or larger, 10 microns or larger, or 100 microns or larger, and more preferably from 100 nanometers to 20 microns, and more preferably, from 2 to 5 microns, is formed in substrate 100 that can be a semiconductor crystalline substrate, such as a silicon substrate. Dielectric patterns, such as dielectric sidewall 101 and dielectric isolators 120 and 124 can be formed in the opening. The dielectric patterns are provided for enabling the following ART processes for forming ART epitaxial crystalline structures 118, 122, 126, and 128. Specifically, the dielectric patterns 101 and 120 define an opening with an aspect ratio commensurate with the aspect ratio needed for forming an ART epitaxial crystalline structure in the opening between patterns 101 and 120. The dielectric patterns 120 and 124 define an opening with an aspect ratio commensurate with the aspect ratio needed for forming an ART epitaxial crystalline structure in the opening between patterns 120 and 124. The dielectric patterns 124 and 103 define an opening with an aspect ratio commensurate with the aspect ratio needed for forming an ART epitaxial crystalline structure in the opening between patterns 124 and 103. Such dielectric patterns can be formed in multiple layers (e.g., stacked three or more vertically).

The dielectric patterns can be formed in many ways. In one example, after forming the large trench in substrate 100 by for example, a STI process, a dielectric layer having a dielectric material for dielectric patterns is deposited in the large opening. The deposited dielectric layer can be patterned to have a depth $H_d$ measured from the bottom of the large opening to the top surface of the patterned dielectric layer. The depth $H_d$ can have any suitable values, which is preferably equal to or larger than the threshold height within which the ART epitaxial structure formed in an opening (e.g. the opening between dielectric pattern 101 and 120) has dislocation defects.

The patterned dielectric layer in the large opening can be further patterned so as to form dielectric patterns 101, 120, 124, and 103. The bottom portions of the openings between dielectric patterns 101 and 120, between 120 and 124, and between 124 and 103 are removed so as to expose the substrate 100.

With the dielectric patterns formed in the large opening, an ART process can be performed so as to form ART epitaxial structures 118, 122, and 126. By overgrowing the ART structures 118, 122, and 126, overgrown crystalline portion 128 with a large size can be obtained. The overgrown crystalline portion 128 can have a width $W_{in}$ that is substantially equal to the width of the large opening formed in substrate 100. For example, the overgrown crystalline portion 128 can have a width $W_{in}$ of 100 nanometers or larger, 500 nanometers or larger, 1 micron or larger, 2 microns or larger, 5 microns or larger, 10 microns or larger, or 20 microns or larger, and more preferably, from 2 to 5 microns. A semiconductor device or an element of a semiconductor device with a desired large size (e.g. 100 nanometers or larger, 500 nanometers or larger, 1 micron or larger, 2 microns or larger, 5 microns or larger, 10 microns or larger, or 20 microns or larger, and more preferably, from 2 to 5 microns) can thus be formed at or in the overgrown crystalline portion 128.

Figure 4:
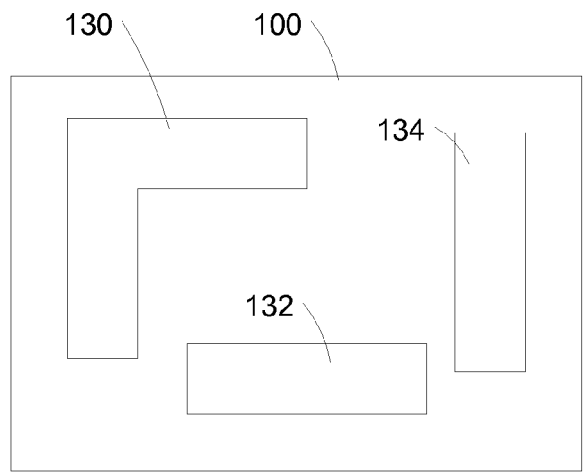
FIG. 4 diagrammatically illustrates a top view of an exemplary layout of multiple trenches in a substrate capable for growing epitaxial crystalline materials.

The openings formed in a substrate by using trenches, recesses, openings or the like as described above can have any desired shapes or layouts, an exemplary of which is diagrammatically illustrated in a top view in FIG. 4. Referring to FIG. 4, an opening can have other shapes such as a 90° angle shape, such as opening 130. Of course, an opening can have other shapes, such as circular, donut, polygonal, and many other possible shapes. Multiple openings can be formed in the opening with any desired layouts. For example, rectangular openings 134 and 132 can be perpendicular or parallel or can be arranged to have any desired angles therebetween.

Figure 5:
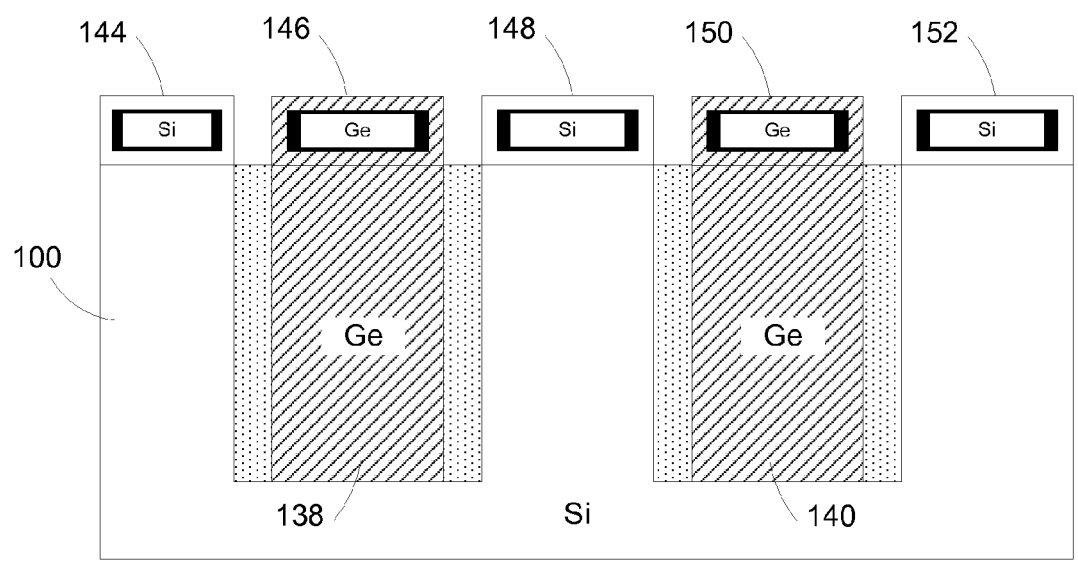
FIG. 5 diagrammatically illustrates an exemplary structure having non-silicon semiconductor devices integrated in a silicon process.

Exemplary methods as described above with reference to FIG. 1a through FIG. 1d or FIG. 2 can enable integration of non-silicon semiconductor devices into a silicon process. For demonstration purposes, FIG. 5 diagrammatically illustrates one of the examples. Referring to FIG. 5, openings are formed by using a STI process in silicon substrate 100. Germanium (or InGaAs or other semiconductor materials such as a III-V group semiconductor material) ART crystalline structures 138 and 140 are formed in the STI openings in silicon substrate 100. Germanium based (or InGaAs or other semiconductor materials such as a III-V group semiconductor material based) semiconductor devices 146 and 150, such as photodetectors are formed at ART structures 138 and 140. A buffer layer (e.g., 10-100 nm) can be between the substrate 100 and the ART crystalline structures 138 and 140 for bonding, adhesion or improved device characteristics purposes. Silicon based devices or elements of semiconductor devices 144, 148 and 152 are formed at the patterns of substrate 100 using standard silicon processes, such as CMOS processes. As such, non-silicon semiconductor devices of elements of non-silicon based semiconductor devices are integrated (e.g., co-planar) in the silicon process.

In examples of forming ART epitaxial structures in STI trenches that are formed in a substrate, such as a silicon substrate, the substrate patterns, such as the silicon patterns around the openings, can be treated. For example, the substrate patterns can be intentionally passivated for protecting the substrate patterns and the ART structures. This can be of great importance when the thermal and/or mechanical properties of the substrate and the ART structures mismatch, which may cause physical and/or chemical damages to the ART structures and/or to the substrate patterns due to the mismatch. For example, physical damages may occur to the ART structures and/or the substrate patterns when the CTE (coefficient-of-thermal-expansion) of the ART structures and the substrate patterns do not match. In one example, the substrate patterns can be passivated by oxidization or nitridization so as to form a protection layers on the exposed surfaces of the substrate patterns or the interfaces between the substrate patterns and the ART structures.

Figure 6:
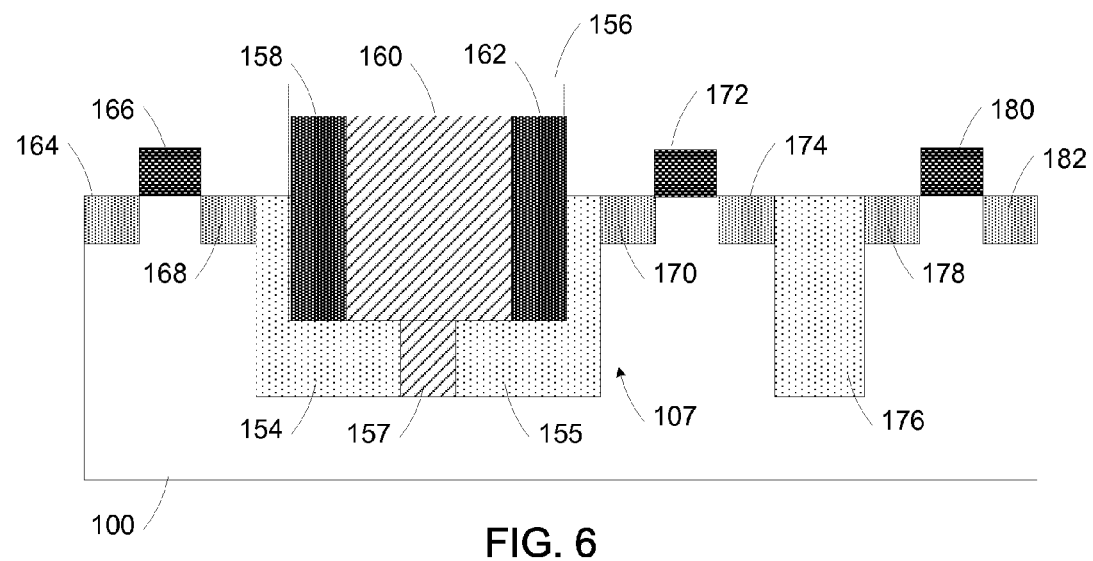
FIG. 6 diagrammatically illustrates an exemplary structure having a p-i-n structure formed in a shallow-trench-insulator region.

As an exemplary implementation of the method and the structure as described above with reference to FIG. 2, an exemplary structure having a p-i-n structure formed in an ART epitaxial crystalline structure is diagrammatically illustrated in FIG. 6. Referring to FIG. 6, STI trench 107 is formed in semiconductor substrate 100, which can be a silicon substrate or other semiconductor substrates. Isolation patterns 154 and 155 are formed within the STI trench (107) and define opening 157 therebetween. Opening 157 can have a height that is substantially equal to or larger than the critical height under which the ART crystalline structure formed in the opening 157 has dislocation defects and above which the ART crystalline structure is substantially free from dislocation defects. An ART epitaxial crystalline structure can be grown in opening 157. By overgrowing the ART structure in opening 157, a large ART overgrown portion 156 is obtained.

A p-i-n structure having p-type region 158, intrinsic region 160, and n-region 162 is formed in overgrown crystalline portion 156. The p-type region 158 and the n-type region 162 can be obtained by doping. Because the overgrown crystalline portion 160 can have a large size, such as 100 nanometers or larger, 500 nanometers or larger, 1 micron or larger, 2 microns or larger, 5 microns or larger, 10 microns or larger, or 20 microns or larger, and more preferably, from 2 to 5 microns, the intrinsic i region 160 can be large, such as 100 nanometers or larger, 500 nanometers or larger, 1 micron or larger, 2 microns or larger, 5 microns or larger, 10 microns or larger, and more preferably, from 2 to 5 microns.

Other circuitry can be formed on the patterned semiconductor substrate 100, such as the transistor having source 164, gate 166, and drain 168, the transistor having source 170, gate 172, and drain 174, and the transistor having source 178, gate 180, and drain 182. The source, gate, and drain of a transistor can be formed by a standard silicon process, such as a CMOS process. For example, the sources and drains of the transistors can be formed by doping; and the gates of the transistors can be formed by a standard silicon based lithography process. Other features can also be formed in the substrate 100. For example, isolation unit 176 can be formed between transistors so as to isolating the transistors. In one example, the semiconductor device (e.g. 156) formed on the ART structure can be substantially coplanar with one or more other semiconductor devices (e.g. transistors) on substrate 100. For example, the top surfaces of 158, 160, and 162 of device 156 can be made substantially coplanar with the transistors formed on substrate 100.

Figure 7:
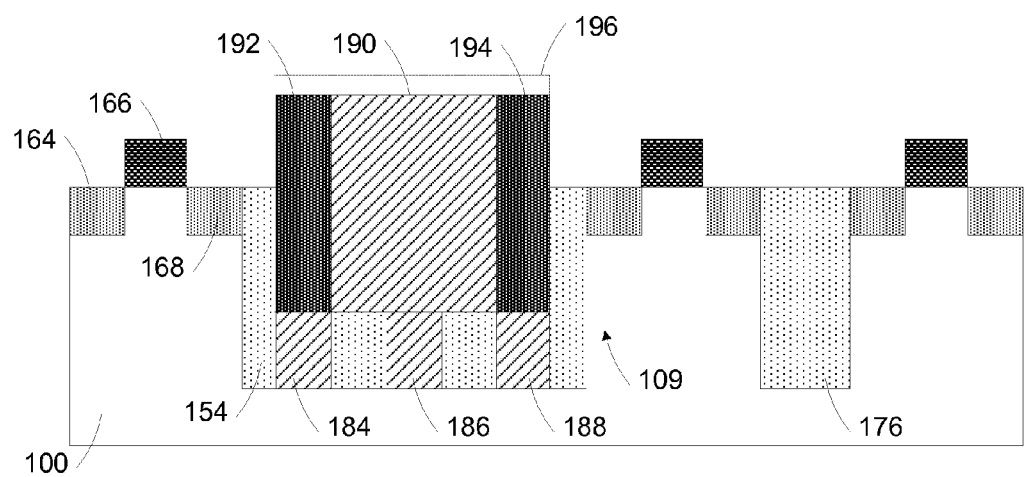
FIG. 7 diagrammatically illustrates another exemplary structure having a p-i-n structure formed in a shallow-trench-insulator region.

As an exemplary implementation of the method and the structure as described above with reference to FIG. 3, an exemplary structure having a p-i-n structure formed in an ART epitaxial crystalline structure is diagrammatically illustrated in FIG. 7. Referring to FIG. 7, STI trench 109 is formed in semiconductor substrate 100, which can be a silicon substrate or other semiconductor substrates. Multiple isolation patterns, such as dielectric pattern 154 are formed within the STI trench 109 using for example the method as described above with reference to FIG. 3, which will not be repeated herein. Openings 184, 186, and 188 are defined by the isolation patterns.

ART epitaxial crystalline growth can be performed in the openings 184, 186, and 188. By overgrowing or through the combination of overgrowing and coalescing of ELO portions of the ART structures in openings 184, 186, and 188, overgrown crystalline portion 196 is obtained. The overgrown crystalline portion 196 can have a large dimension, such as a lateral and/or vertical dimensions of 100 nanometers or larger, 500 nanometers or larger, 1 micron or larger, 2 microns or larger, 5 microns or larger, 10 microns or larger, and preferably, from 2 to 5 microns.

A p-i-n structure having p-type region 192, intrinsic region 190, and n-region 194 is formed in overgrown crystalline portion 196. The p-type region 192 and the n-type region 194 can be obtained by doping. Because the overgrown crystalline portion 196 can have a large size, the intrinsic i region 190 can be large, such as 100 nanometers or larger, 500 nanometers or larger, 1 micron or larger, 2 microns or larger, 5 microns or larger, 10 microns or larger, and more preferably from 100 nanometers to 200 microns, and preferably, from 2 to 5 microns.

Other circuitry can be formed on the patterned semiconductor substrate 100, such as the transistor having source 164, gate 166, and drain 168. The source, gate, and drain of a transistor can be formed by a standard silicon process, such as a CMOS process. For example, the sources and drains of the transistors can be formed by doping; and the gates of the transistors can be formed by a standard silicon based lithography process. Other features can also be formed in the substrate 100. For example, isolation unit 176 can be formed between transistors so as to isolating the transistors. In one example, the semiconductor device (e.g. 196) formed on the ART structure can be substantially coplanar with one or more other semiconductor devices (e.g. transistors) on substrate 100. For example, the top surfaces of 192, 190, and 194 of device 196 can be made substantially coplanar with the transistors formed on substrate 100.

As can be seen in the examples as illustrated in FIG. 6 and FIG. 7, lateral p-i-n structures or p-n junctions can be made in ART epitaxial crystalline semiconductor structures, wherein the semiconductor structures can be comprised of non-silicon materials. For example, the carrier channel from the p region to the n region of a lateral p-i-n or p-n junction is parallel to the major surface of the substrate 100 or is substantially perpendicular to the direction along which the ART epitaxial crystalline materials are formed.

Figure 8:
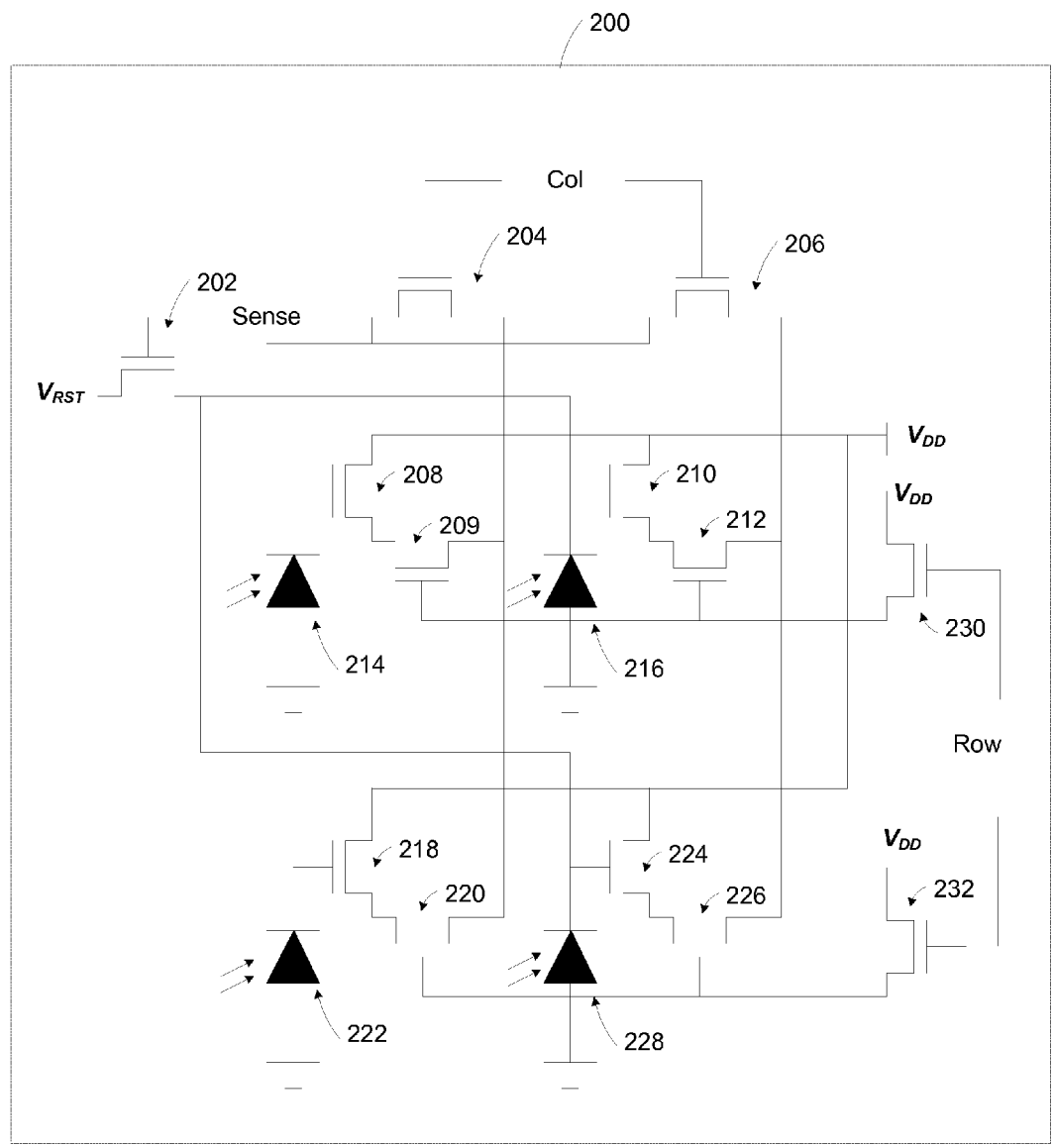
FIG. 8 is a diagram of a portion of an exemplary array of photodetectors.

The method of making a semiconductor device can be of great importance in making photodetector pixels that are comprised of an array of p-i-n structures. For demonstration purposes, FIG. 8 through FIG. 14 diagrammatically demonstrate a portion of an array of photodetector pixels that are formed by exemplary methods as described above. In particular, non-silicon semiconductor devices (e.g. non-silicon semiconductor sensor 214) can be integrated with silicon semiconductor devices (e.g. silicon transistors 208, 209, 202, and 204) using the method as discussed above. Referring to FIG. 8, four photodetector pixels of the photodetector array are shown for simplicity purposes. In general, the photodetector array may comprise any desired number of photodetector pixels, which is referred to as the native resolution of the photodetector array. In one example, the photodetector array may have a native resolution of 640× 480 (VGA) or higher, such as 800×600 (SVGA) or higher, 1024×768 (XGA) or higher, 1280×1024 (SXGA) or higher, 1280×720 or higher, 1400×1050 or higher, 1600×1200 (UXGA) or higher, and 1920×1080 or higher, or integer multiples and fractions of these resolutions. Of course, other resolutions are also applicable depending upon specific applications.

Each photodetector can have a characteristic size of less than 500 nanometers, 500 nanometers or larger, 1 micron or larger, such as 1.5 microns or larger, 2 microns or larger, 5 microns or larger, 10 microns or larger, or from 5 to 10 microns. The pitch, which is referred to as the distance between adjacent photodetectors in the array, can be any suitable values, such as 500 nanometers or larger, 1 micron or larger, such as 1.5 microns or larger, 2 microns or larger, 5 microns or larger, 10 microns or larger, or from 5 to 10 microns.

The portion of the exemplary photodetector array 200 comprises transistors 202, 204, 206, 208, 209, 210, 212, 218, 220, 224, 226, 230, and 232, and photo-sensors 214, 216, 222, and 228. The photo-sensors convert the light energy into voltage signals, and a group of transistors amplify the voltage signals (and convert the amplified voltage signals into digital signals if necessary). Another group of transistors can be provided for addressing and reading out the outputs of individual photodetector pixels in the columns and rows of the array by column and row addressing/reading signals.

For example, sensor 214 converts the received light intensity into a voltage signal. When an active signal (column signal) is delivered to transistor 209 through transistor 204 from a column decoder (which not shown in the figure), the output voltage signal from sensor 214 is amplified by transistor 208. When a row signal (row active signal) is delivered to the gate of transistor 209 through transistor 230, the amplified voltage signal $V_{DD}$ is read out through the output of transistor 208. The output voltage signal $V_{DD}$ can be digitized by other devices, such as an ADC unit, which is not shown in the figure.

Figure 9:
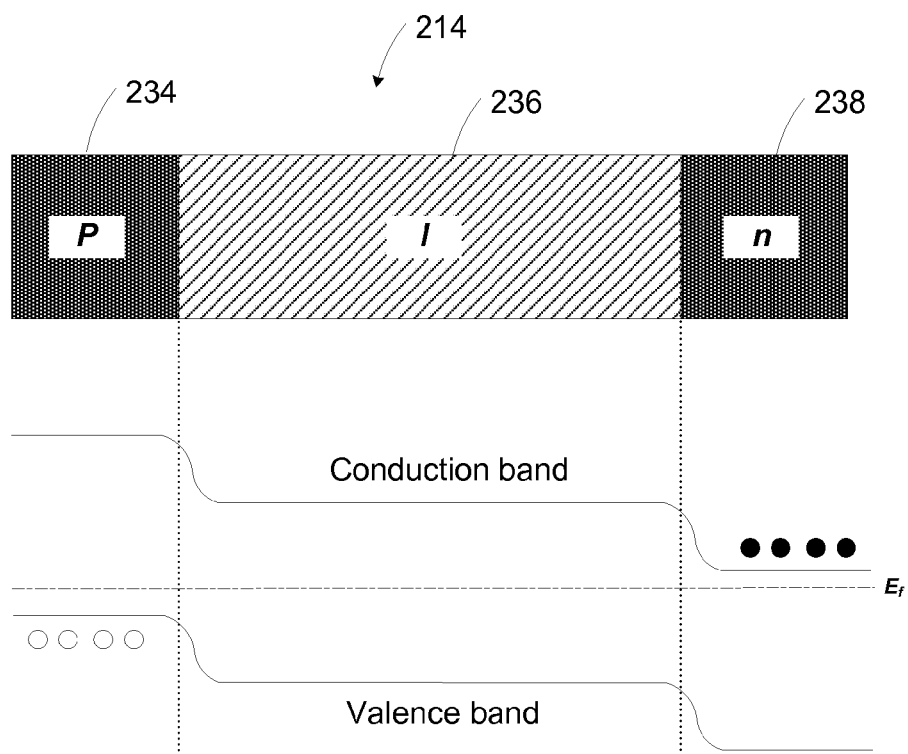
FIG. 9 diagrammatically illustrates an energy-band structure of a p-i-n structure at zero bias voltage.

The sensors 214, 216, 222, and 228 each can be a p-i-n structure as diagrammatically illustrated in FIG. 9. Referring to FIG. 9, sensor 214 comprises p region 234, i region 236, and n region 238. The p-i-n structure 214 can be formed in many ways, such as those described above with reference to FIG. 5, FIG. 6, and FIG. 7. Electron transportations properties of the p-i-n structure can be interpreted by energy band diagrams as diagrammatically illustrated in FIG. 9 and FIG. 10.

Referring to FIG. 9, the conductive and covalence bands of the p region 234, i region 236, and n region 238 are substantially flat in the absence of external voltages. Fermi energy $E_f$ is close to the covalence band of the p region such that the p region is a hole-rich region. Because the i region is an intrinsic semiconductor region, the Fermi energy $E_f$ is around the center of the gap between the covalence and conductive bands. Fermi energy $E_f$ is close to the conductive band of the n region such that the n region is an electron-rich region.

Figure 10:
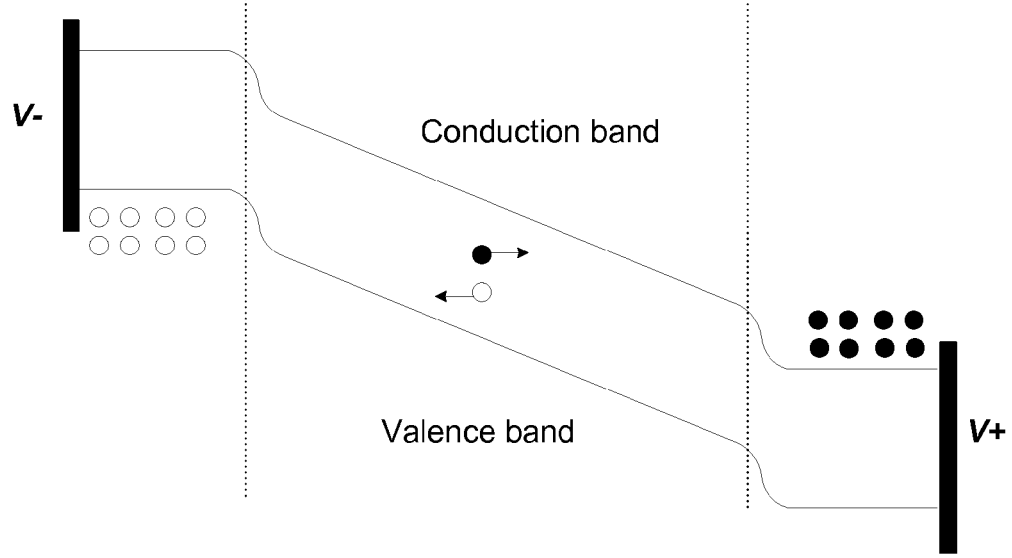
FIG. 10 diagrammatically illustrates the energy-band structure of the p-i-n structure in FIG. 9 at a bias voltage.

In the presence of external voltage V+ and V− respectively applied to the n and p regions, as diagrammatically illustrated in FIG. 10, the conductive and covalence bands of the p region is elevated; while the conductive and covalence bands of the n region is declined. As a consequence, the conductive and covalence bands of the intermediate i region inclines. The Fermi energy $E_f$ also inclines the energy gap of the i region. The inclined Fermi energy drives electrons in the i region towards the n region; and holes in the i region toward the p region. This transportation of electrons and holes forms current in a carrier channel connecting the p and n regions.

Figure 11:
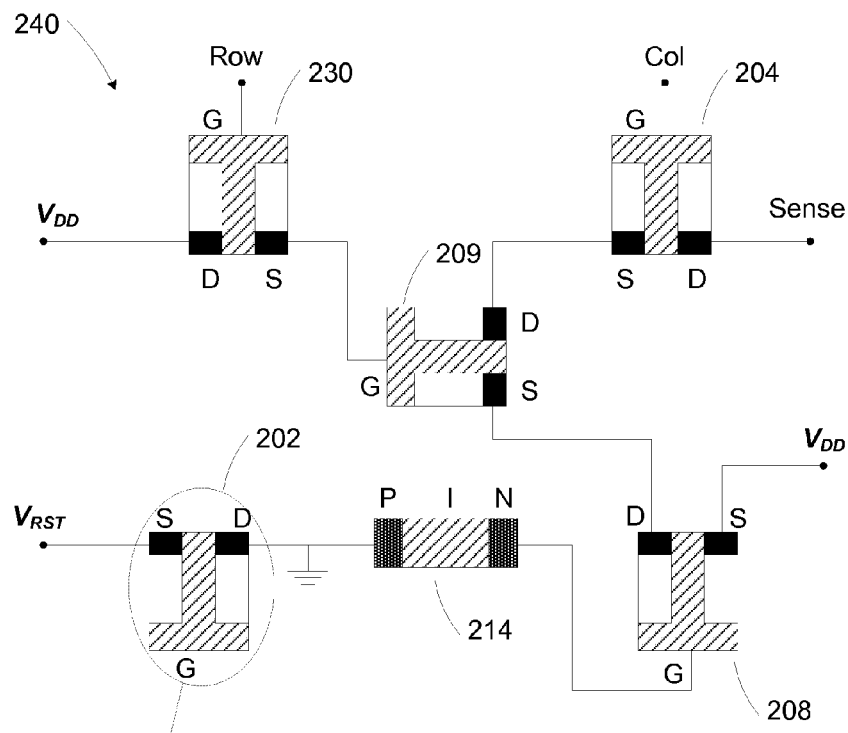
FIG. 11 is a diagram showing a portion of the array of photodetectors in FIG. 8.

The transistors and sensors of the photodetectors illustrated in FIG. 8 can be formed on ART epitaxial crystalline structures, which can be better illustrated in FIG. 11. For simplicity purposes, sensor 214 and the transistors around sensor 214 are shown in FIG. 11. The exemplary connection of sensor 214 to the transistors is also applicable to other sensors and transistors.

Referring to FIG. 11, sensor 214 has p, i, and n regions; and sensor 214 can be a non-silicon semiconductor device. The transistors 202, 204, 208, and 209 can be silicon based transistors. The p region is grounded and is connected to the drain of transistor 202. The source of transistor 202 is connected to reset signal p region $V_{RST}$. The p region of sensor 214 is connected to the gate of transistor 208. The source of transistor 208 acts as an output for outputting amplified voltage signal $V_{DD}$. The drain of transistor 208 is connected to the source of transistor 209. The gate of transistor 209 is connected to the source of row selection transistor 230, whose gate is connected to the row signal from a row decoder. The drain of transistor 230 is connected to amplified voltage signal $V_{DD}$.

The drain of transistor 209 is connected to the source of column selection transistor 204, whose gate is connected to the column signal from a column decoder. The drain of row selection transistor 204 is connected to a sense signal.

Figure 12:
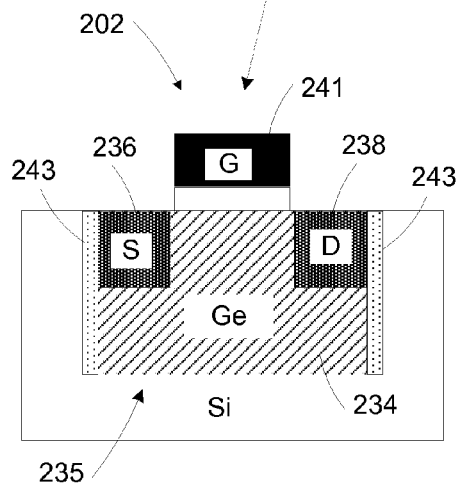
FIG. 12 diagrammatically illustrates an exemplary configuration of the transistors in the photodetector array in FIG. 8.

The transistors in FIG. 11 can have any suitable configurations. In particular, the non-silicon semiconductor sensor 214 can be integrated with the silicon-based transistors (e.g. 202, 208, 209, 204, and 230). Alternatively, the transistors such as transistor 202 can be other types of transistors, such as germanium (or other silicon or non-silicon) based transistors as diagrammatically illustrated in FIG. 12. Referring to FIG. 12, a trench 235 or an opening is formed in a silicon substrate. The sidewalls of the trench are covered with a dielectric layer, such as an oxide layer 243. The sidewall cover layer 243 can be formed in many ways. For example, the sidewall cover layer 243 can be formed by depositing or growing the sidewall cover layer in the trench followed by removing the cover layer on the bottom surface of the trench. Alternatively, the trench can be filled with the sidewall cover layer followed by patterning/etching to form the desired sidewall cover layer in the trench. A germanium (or other silicon or non-silicon semiconductor materials) epitaxial crystalline structure 234 is formed in the trench of the silicon substrate using, for example, the method as discussed above with reference to FIG. 6. Source 236 and drain 238 of the transistor are formed in the germanium epitaxial crystalline structure 234 by doping. Gate 241 is formed on the germanium crystalline structure with an oxide layer laminated therebetween.

Figure 13:
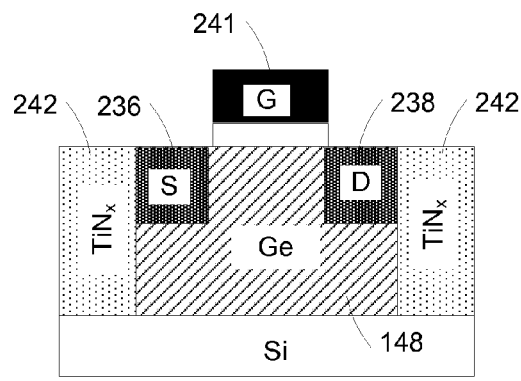
FIG. 13 diagrammatically illustrates another exemplary configuration of the transistors in the photodetector array in FIG. 8.

Another exemplary configuration of the transistors in FIG. 11 is diagrammatically illustrated in FIG. 13. Referring to FIG. 13, the transistor is formed on a silicon substrate. Dielectric patterns 242 are formed so as to define an opening on the silicon substrate. The dielectric patterns can be formed by depositing a layer of a selected dielectric material, such as $TiN_x$ on the silicon substrate followed by patterning the deposited dielectric layer.

The opening defined by the dielectric patterns has an appropriate aspect ratio, such as 0.5 or larger, 1 or larger, 1.5 or larger or 3 or larger, such that an ART growth process can be performed within the opening. Germanium epitaxial crystalline structure 148 can then be formed in the opening through an ART process. By doping portions of the germanium crystalline structure, source 236 and drain 238 can be obtained with an intrinsic region being laminated therebetween. Gate 241 can be formed above the germanium epitaxial crystalline structure with an oxide layer disposed therebetween.

Figure 14:
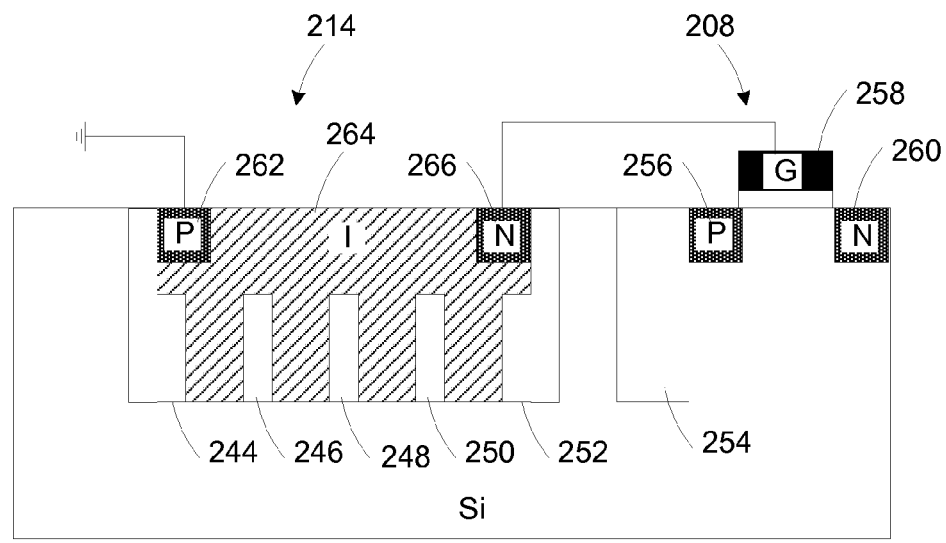
FIG. 14 diagrammatically illustrates an exemplary configuration of the p-i-n structure connected to a transistor in the photodetector array in FIG. 8.

In examples wherein the sensors of the photodetectors illustrated in FIG. 11 desired large areas, such as 1 micron or larger, 2 microns or larger, 5 microns or larger, 10 microns or larger, or from 5 to 10 microns, the p-i-n structure of the sensor can be formed using methods as described above with reference to FIG. 1, FIG. 2 or FIG. 7 or the like. For demonstration purposes, FIG. 14 diagrammatically illustrates an exemplary electrical connection of the p-i-n structure of the sensor to a transistor. This connection scheme is also applicable to connections of other sensors and transistors.

Referring to FIG. 14, an array of STI process trench structures (or other types of trench structures) 244, 246, 248, 250, and 252 are formed in a silicon substrate. The STI process trench structures can be formed by multiple patterning processes. For example, a patterning process can be performed so as to define the STI process opening from the top surface of the silicon substrate to the top surfaces of STI process patterns 214 and 254. Within the defined opening, another patterning process can be performed so as to define STI process patterns 244, 246, 248, 250, and 252 within the previously defined opening 214.

The adjacent STI patterns of the array of STI patterns 244, 246, 248, 250, and 252 define a series of openings, each of which has an aspect ratio commensurate with the aspect-ratio(s) desired for the following ART processes. With the series of openings between STI patterns 244, 246, 248, 250, and 252, an ART process is performed using a germanium (or other semiconductor materials, such as InGaAs and III-V group materials) so as to form an ART epitaxial crystalline structure. As described above with reference to FIG. 1d or FIG. 7, a large ART portion can be formed above the openings and STI patterns by overgrowing the ART structures or by coalescing the ELO portions of the adjacent ART structures. Regardless of the growing process, the ART portion 264 can have the top surface that is substantially coplanar to the substrate (e.g. the silicon substrate) or can be above the top surface of the silicon substrate. Accordingly, the semiconductor device (or structure) formed on the ART structure (e.g. 264) can be substantially coplanar to another semiconductor device (e.g. the transistor having source 256, gate 258, and drain 260) formed at the top surface of the substrate. The p-i-n structures can then be formed in the large ART portion. Specifically, the p and n regions can be obtained by doping the intrinsic large ART portion with appropriate dopants. The intrinsic i region can have a large size, such as 1 micron or larger, 1.5 microns or larger, 2 microns or larger, 5 microns or larger, 10 microns or larger, or from 5 to 10 microns.

An insulation structure 254 can be formed by a STI process. Transistors having source 256, drain 260, and gate 258 can be formed on the silicon substrate by using a standard silicon process, such as a CMOS process. The p region of the p-i-n structure of the sensor 214 is grounded. The n region of the p-i-n structure is connected to the gate of transistor 208.

Figure 15:
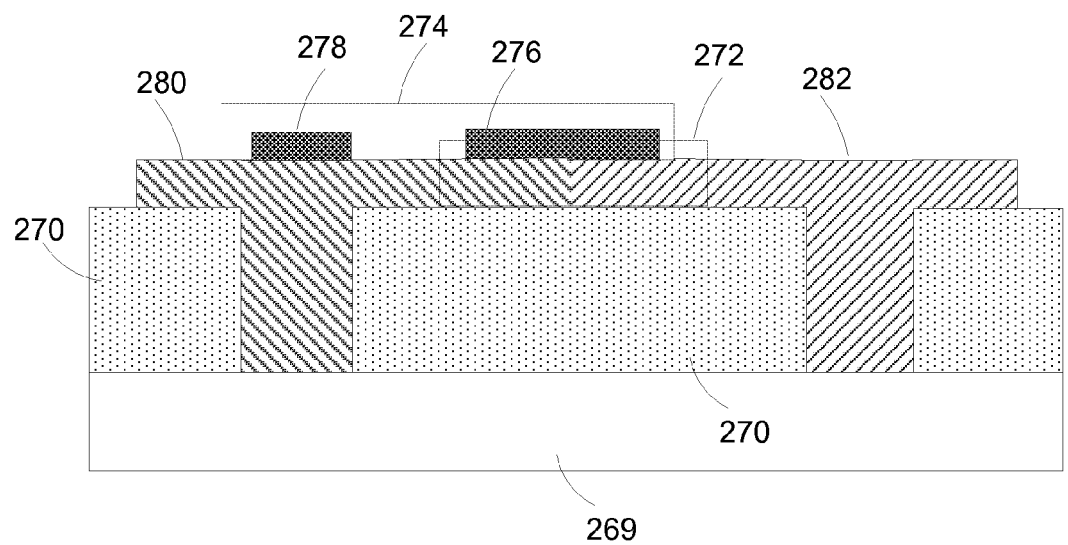
FIG. 15 diagrammatically illustrates a cross-sectional view of an exemplary semiconductor device formed at or in a coalesced region formed by adjacent ART (aspect-ratio-trapping) structures.

Other than forming a semiconductor device, such as a photodetector, a transistor, a LED or a laser, on a dislocation-free region in an epitaxial crystalline ART structure, the semiconductor device can alternatively be formed on a coalesced region between adjacent ART structures, an example of which is diagrammatically illustrated in FIG. 15. Referring to FIG. 15, substrate 269, which can be a semiconductor substrate, such as a silicon substrate is provided. Dielectric layer 270 is deposited on the substrate followed by patterning so as to generate openings in the dielectric layer. An ART process can be performed to form ART epitaxial crystalline structures 280 and 282. By overgrowing the ART structures, the ELO portions of the adjacent ART structures 280 and 282 can be coalesced to form a coalesced region 272. Semiconductor device 276, such as a p-i-n structure or p-n junction, a transistor, or other semiconductor devices can be formed at or in the coalesced region 272. Element 276 can alternatively be a member of semiconductor device 274 that further comprises member 278, which can be formed at the non-coalesced ART region, such as the non-coalesced region of ART structure 280.

Figure 16:
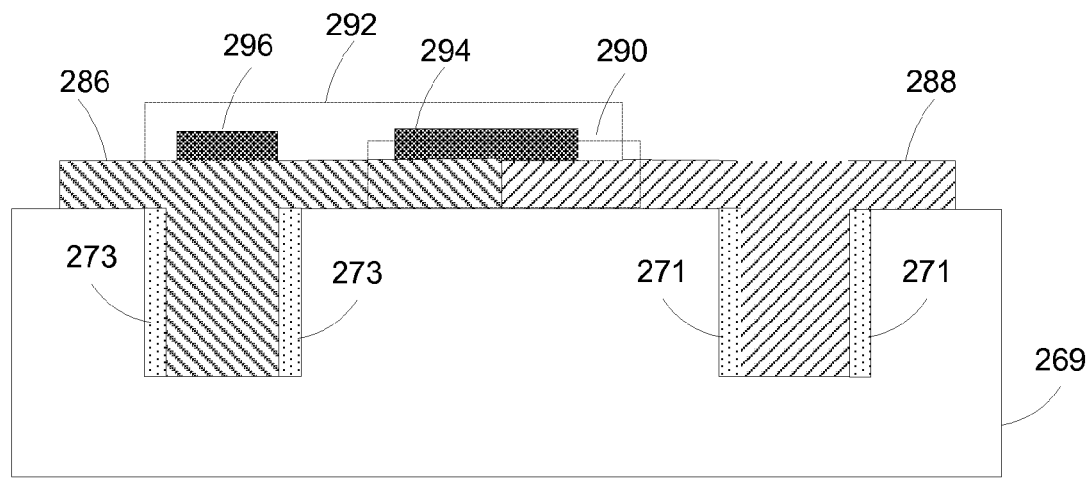
FIG. 16 diagrammatically illustrates a cross-sectional view of another exemplary semiconductor device formed at or in a coalesced region formed by adjacent ART (aspect-ratio-trapping) structures.

Alternative to forming semiconductor devices on coalesced region of adjacent ART structures that are formed in openings defined by dielectric patterns as described above with reference to FIG. 15, a semiconductor device can be formed at or in a coalesced region of adjacent ART structures that are formed in substrates, trenches, STI trenches or openings, an example of which is diagrammatically illustrated in FIG. 16.

Referring to FIG. 16, ART epitaxial crystalline structures 286 and 288 are formed from STI trenches in substrate 269, which can be a semiconductor substrate, such as a silicon substrate, wherein the sidewalls of the trenches are covered by dielectric layers 271 and 273, which may be comprised of an oxide material or other suitable materials. The dielectric layer can be formed in the same way as the dielectric layer 243 in FIG. 12. The ELO portions of ART structures 286 and 288 coalesce resulting in coalesced region 290. Semiconductor device 294, such as a p-i-n or p-n junction, a transistor, or other semiconductor devices can be formed at or in the coalesced region 290. Element 294 can alternatively be a member of semiconductor device 292 that further comprises member 296, which can be formed at the non-coalesced ART region, such as the non-coalesced region of ART structure 286.

Figure 17:
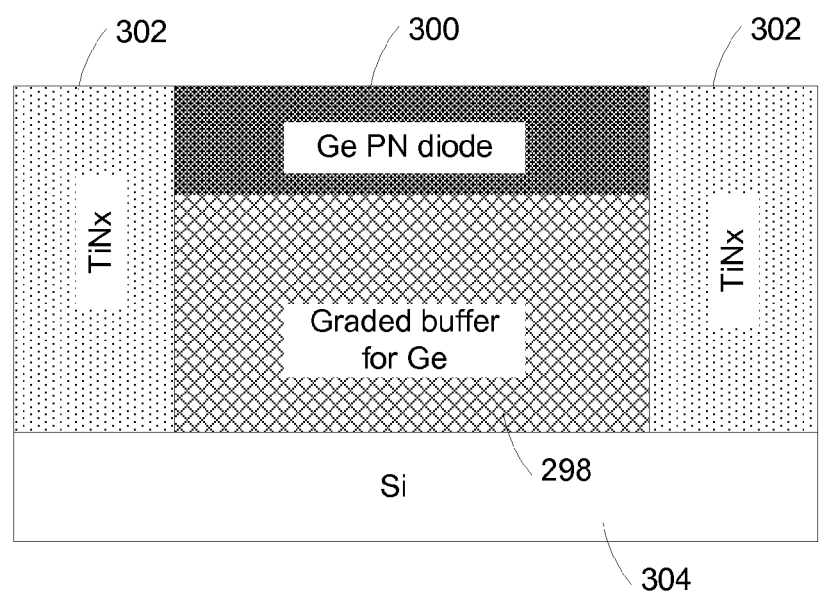
FIG. 17 diagrammatically illustrates a cross-sectional view of an exemplary structure having a semiconductor device formed on a graded buffer layer in an opening of a dielectric layer.

In addition to the methods described above, integration of a non-silicon based semiconductor device into a silicon process can alternatively be achieved by using buffer layers. Graded buffer layers can be of great value for heteroepitaxy growth, such as heteroepitaxy growth on silicon. As a way of example, graded buffer layers can be used for heteroepitaxy (e.g. in silicon) in relatively larger areas as compared to the narrow trench areas (e.g. STI trench structures as in examples of ART). FIG. 17 diagrammatically illustrates an example. Referring to FIG. 17, in order to form a non-silicon based semiconductor device, such as a germanium (or other semiconductor materials, such as InGaAs and III-V group semiconductor materials) semiconductor device (e.g. ap-n or p-i-n structure) on a silicon substrate, a graded buffer layer comprised of a selected semiconductor material is deposited on the silicon substrate. The graded buffer layer may have a size (e.g. the lateral or vertical dimension) such as 100 nanometers or larger, 500 nanometers or larger, 1 micron or larger, 2 microns or larger, 5 microns or larger, 10 microns or larger, or 100 microns or larger, 1 millimeter or larger, 200 millimeters or larger, 500 millimeters or larger, 1 centimeter or larger, or from 10 microns to several centimeters, such as from 10 microns to 500 microns, from 10 microns to 1 millimeter, from 10 microns to 500 millimeters or from 10 microns to 1 centimeter. The graded buffer layer may have other suitable lateral/vertical dimensions in other examples. In the particular example as illustrated in FIG. 17, dielectric patterns 302 of a selected dielectric material, such as $TiN_x$ are formed on silicon substrate 304 and define an opening. In order to form a germanium p-n diode on the silicon substrate 304, graded buffer layer 298 for germanium is deposited in the opening on the silicon substrate 304. In other examples, the buffer can be comprised of other suitable materials, such as GaAs, a III-V group semiconductor material (e.g. SiGe, InGaAs, and InP), or a laminate of GaAs/InP/InGaAs. The graded buffer layer can be formed in many ways such as epitaxial techniques and other suitable techniques.

Germanium p-n diode 300 can then be formed on the graded buffer layer 298 for germanium. It is noted that depending upon different semiconductor devices to be formed on the silicon substrate 304, the graded buffer layer can be comprised of different materials to match the semiconductor device to be formed thereon.

Figure 18:
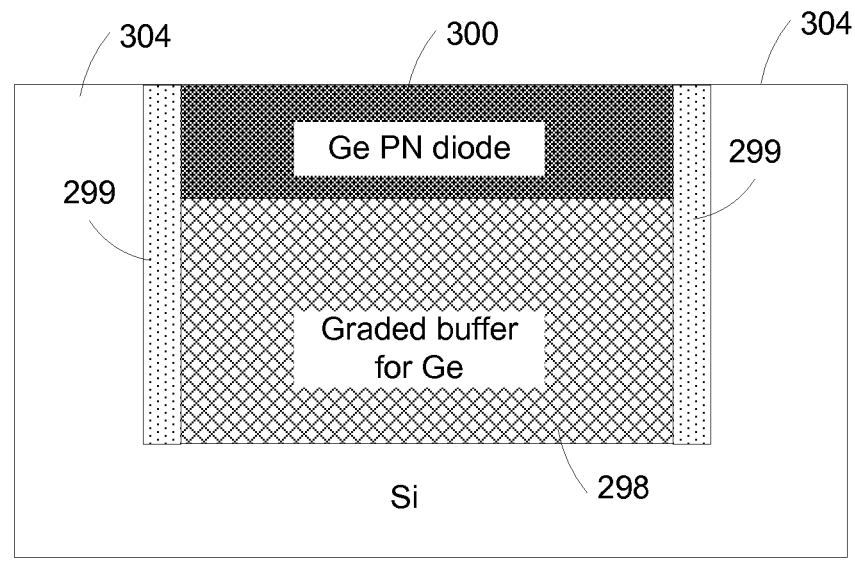
FIG. 18 diagrammatically illustrates a cross-sectional view of an exemplary structure having a semiconductor device formed on a graded buffer layer in a trench formed in a crystalline substrate.

The graded buffer layer can also be used for making semiconductor devices in trenches such as STI trenches formed in a semiconductor substrate, as diagrammatically illustrated in FIG. 18. Referring to FIG. 18, a STI trench is formed in silicon substrate 304. The sidewalls of the trench are covered by dielectric layer 299, which can be comprised of an oxide material or other suitable materials. The dielectric layer can be formed in the same way as the dielectric layer 243 in FIG. 12. A graded buffer layer 298 is disposed in the STI trench. Depending upon the semiconductor device to be formed on the buffer layer and the silicon substrate, the graded buffer layer can be comprised different materials. In the example as illustrated in FIG. 18 wherein a germanium p-n diode is to be formed, the graded buffer layer is correspondingly comprised of a material for matching germanium. Germanium p-n diode 300 is formed on buffer layer 298.

A graded buffer layer may itself comprise a substantially defect (e.g. dislocation defect) free layer; and a device layer for forming a semiconductor device (e.g. a transistor, a photodetector, a solar cell, or other devices) can be formed on such defect free layer. The graded buffer layer may have a size (e.g. the lateral or vertical dimension) such as 100 nanometers or larger, 500 nanometers or larger, 1 micron or larger, 2 microns or larger, 5 microns or larger, 10 microns or larger, or 100 microns or larger, 1 millimeter or larger, 200 millimeters or larger, 500 millimeters or larger, 1 centimeter or larger, or from 10 microns to several centimeters, such as from 10 microns to 500 microns, from 10 microns to 1 millimeter, from 10 microns to 500 millimeters or from 10 microns to 1 centimeter. The graded buffer layer may have other suitable lateral/vertical dimensions in other examples.

The graded buffer layer can be formed on a substrate (e.g. a silicon substrate), or in a region, such as a trench (e.g. a STI trench or other types trenches) that is formed in a substrate or in a dielectric or insulator layer above a substrate.

Figure 19A:
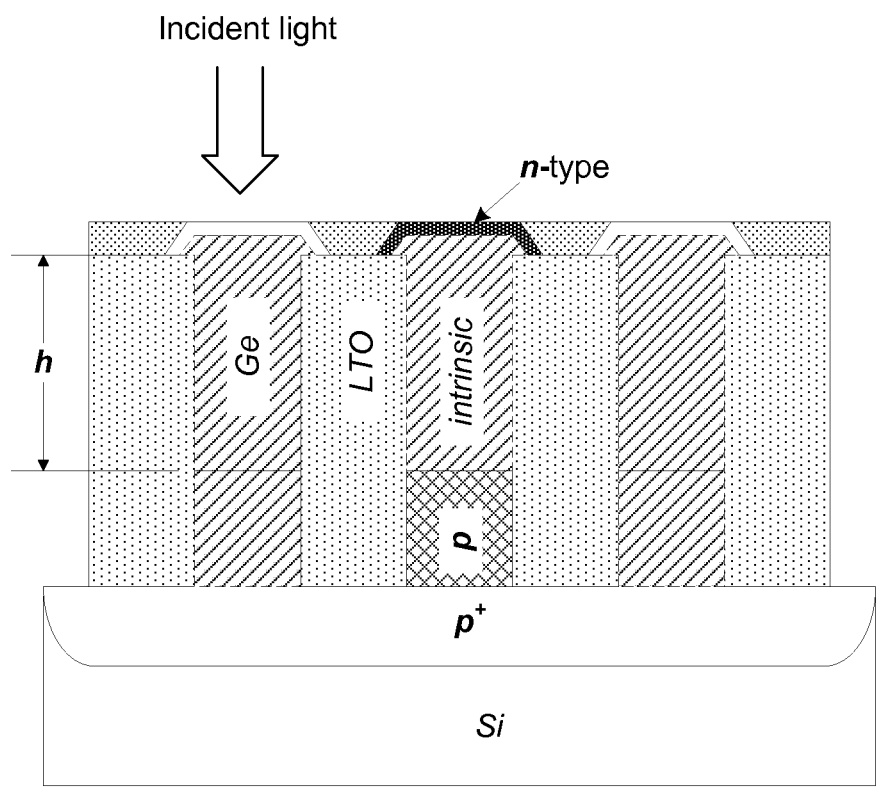
FIG. 19a diagrammatically illustrates a cross-sectional view of a portion of an exemplary array of non-silicon photodetectors integrated in a silicon substrate, wherein the photodetector is capable of detecting light incident thereto from the top.

Referring to FIG. 19a, a cross-sectional view of a portion of an exemplary array of photodetectors is diagrammatically illustrated therein. A heavily doped p+ region is formed in a silicon substrate. The p+ region can then be used as a lower contact for the photodetectors. A dielectric layer, which is comprised of a low-temperature-oxide (LTO) material in this example, is deposited on the silicon substrate (e.g. on the p+ region in the silicon substrate). The deposited LTO layer is patterned so as to form openings and expose the silicon substrate, especially, the p+ region in the silicon substrate. ART epitaxial crystalline structures of a selected material, such as germanium or a III-V group semiconductor material are formed in the openings. The ART structures can be grown with in-situ doping until past the defect regions. The in-situ doped defect-regions can be formed as p-type regions. The ART process can continue until the thickness (e.g. L) is sufficient to allow for desirable levels of absorption of incident light that the photodetector is designed for detecting, such as visible light, ultraviolet light, and/or infrared light. The top portion of the ART structures can then be doped with an appropriate material so as to form n-type regions.

Figure 19B:
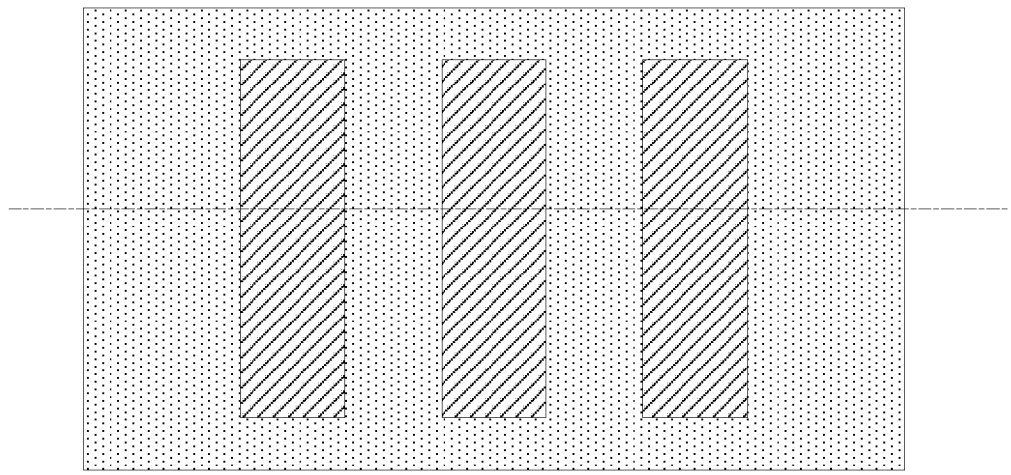

A top view of the photodetectors in FIG. 19a is diagrammatically illustrated in FIG. 19b. Referring to FIG. 19b, three photodetectors are shown for simplicity and demonstration purposes. As discussed above, the photodetector array may comprise any desired number of photodetectors.

The photodetectors in FIGS. 19a and 19b are configured such that the p, i, and n regions of each photo sensor (e.g. the p-i-n structures) are vertically aligned along the growth direction of the ART structures. In photo detection application, light to be detected is directed toward the top of the sensors. In an alternative example, the light to be detected can be directed along the side of the sensors, as diagrammatically illustrated in FIG. 20a.

Figure 20A:
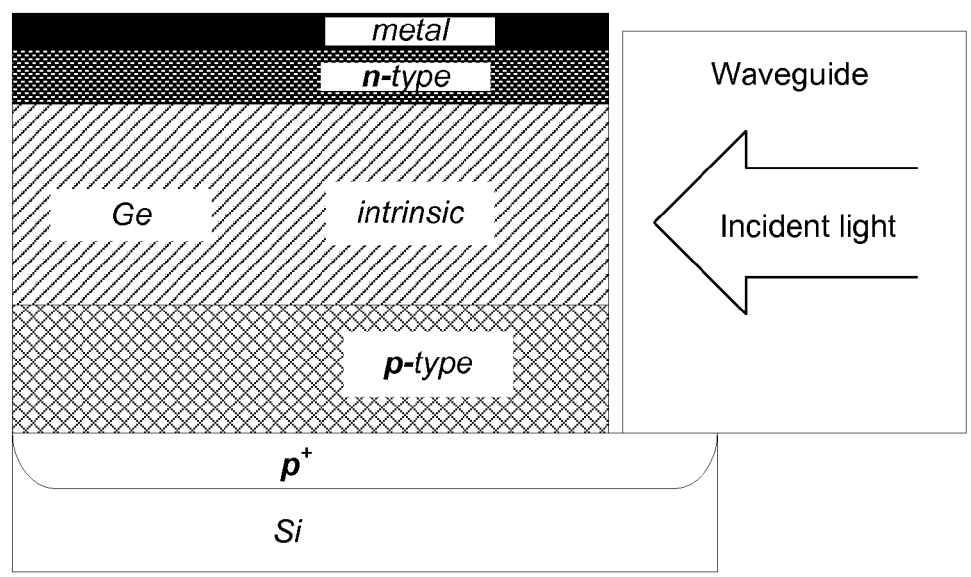
FIG. 20a diagrammatically illustrates a cross-sectional view of a portion of an exemplary array of non-silicon photodetectors integrated in a silicon substrate, wherein the photodetector is capable of detecting light incident thereto from the side.

Referring to FIG. 20a, a heavily doped p+ region is formed in an intrinsic silicon substrate. An ART epitaxial crystalline material comprised of germanium or a III-V semiconductor material is grown in openings of a dielectric layer, such as the dielectric layer comprised of a LTO material in FIG. 19a. With in-situ implantation, p region can be formed in the ART structures, especially the defect regions of the ART structures. The ART structures continue to form the intrinsic regions. By in-situ or other doping techniques, n-regions can be formed in the top regions of the ART structures. A metal contact then can be formed on and physically contact to the n-regions.

In light detection application, light to be detected is directed from the side of the photodetector as diagrammatically illustrated in FIG. 20a. This configuration allows for light detection to occur in-plane with the silicon substrate. Furthermore, it allows for the growth thickness of ART structures to be independent from the absorption depth.

Figure 20B:
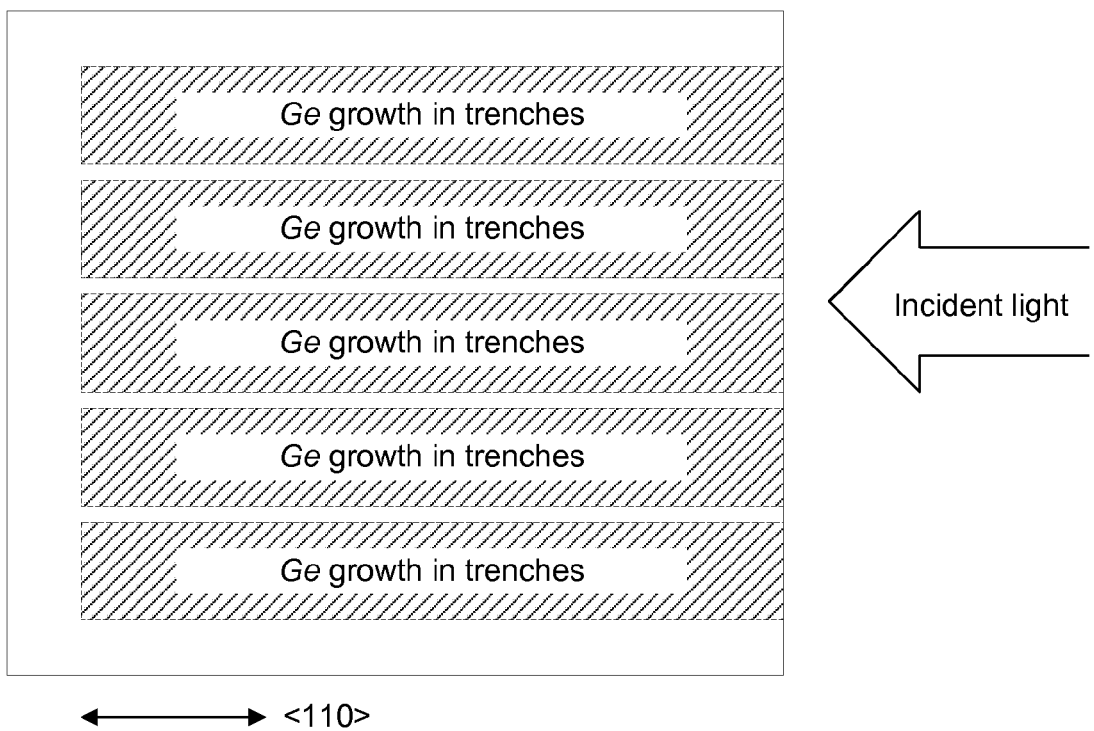

A top view of the photodetectors is diagrammatically illustrated in FIG. 20b. Referring to FIG. 20b, germanium (or other semiconductor materials, such as a III-V semiconductor material) epitaxial crystalline ART structures are formed on a substrate (e.g. on the heavily doped p+ region formed in the silicon substrate). The germanium ART structures in this example are deployed such that the lengths (in the top view) of the germanium ART structures are aligned to the <110> direction of the silicon substrate, however the application is not intended to be so limited as other alignments are considered available. The incident light to be detected is directed toward the side of the germanium ART structures.

Figure 21A:
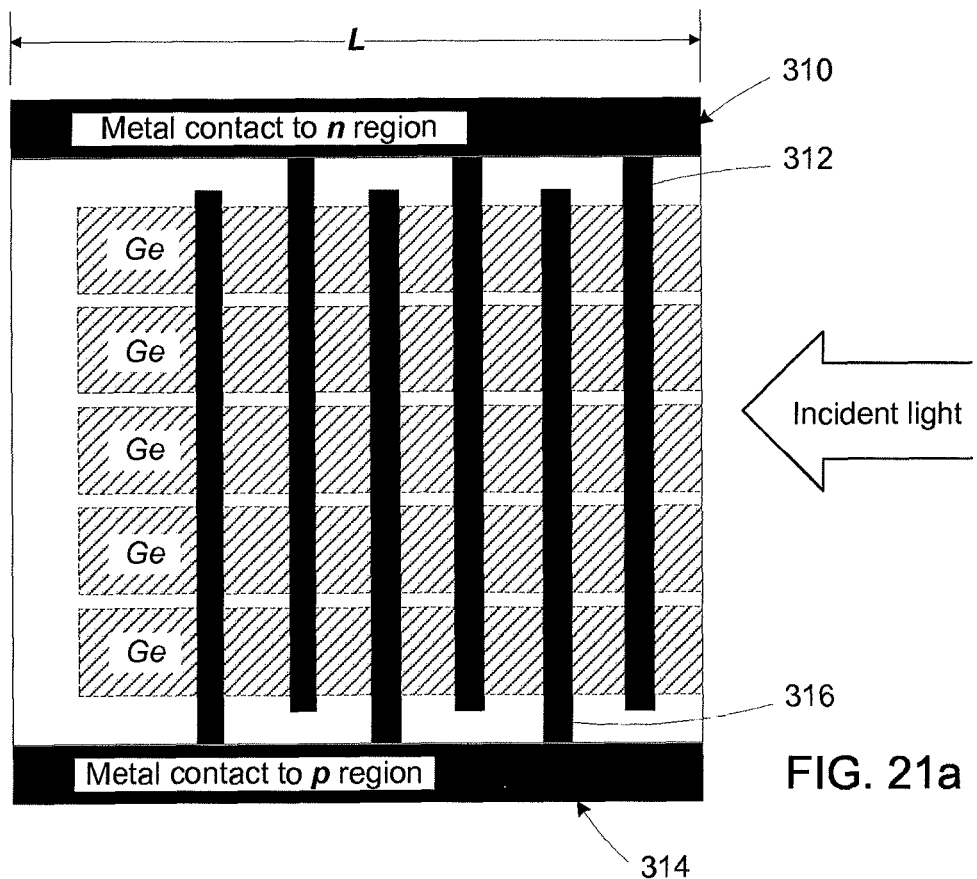
FIG. 21a diagrammatically illustrates a first view of an exemplary configuration of electrical connections of photodetectors to electrical contacts.
Figure 21B:
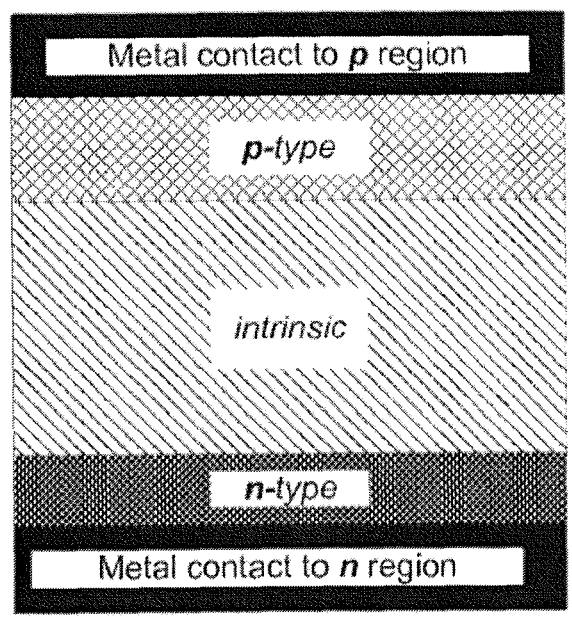
FIG. 21b diagrammatically illustrates a second view of the exemplary configuration of electrical connections of photodetectors to electrical contacts.

The electrical connection of the photodetectors as illustrated in FIG. 20a and FIG. 20b can have many suitable configurations, one of which is diagrammatically illustrated in FIG. 21a and FIG. 21b. Referring to FIG. 21a, the exemplary electrical connection scheme is illustrated in a top view. A contact to n region and a contact to p region are provided. Each contact comprise at least an elongated contact beam that spans across and electrically connected to substantially all regions of a particular type (e.g. the n or the p type) of the photodetectors. For example, metal contact 310 for contacting to n regions comprises contact beam 312. Contact beam 312 spans across substantially all ART structures; and is connected to the n regions of the ART structures. This connection is better illustrated in FIG. 21b that diagrammatically illustrates the connection of the metal contacts to the p and n regions of a p-i-n structure in a photodetector.

Metal contact 314 comprises at least one contact beam, such as contact beam 316. The contact beam spans across substantially all photodetectors; and is electrically connected to the p regions of the photodetectors. This connection is better illustrated in FIG. 21b.

In order to improve the quality and reliability of the electrical connection between the metal contacts to their designated regions, each contact may comprise multiple contact beams as diagrammatically illustrated in FIG. 21a. In the example as illustrated in FIG. 21a, the contact beams of each metal contact are uniformly deployed across the photodetectors within the light absorption range L. Contact beams of different contacts can be alternately disposed. Other configurations are also applicable. For example, multiple (e.g. 2 or more) contact beams of one metal contact can be disposed between two adjacent contact beams of the other contact.

In another exemplary configuration, a contact beam of a metal contact can be connected to a group of photodetectors but not all photodetectors. The photodetectors not electrically connected to one contact beam can be electrically connected to another contact beam. In other words, a metal contact can have at least two contact beams that are electrically connected to two different groups of photodetectors; whereas the two different groups have at least one different photodetector.

The method as described above can be applied to make semiconductor devices formed in or at ART structures, wherein the defect regions of the ART structures are not electrically isolated from rest of the semiconductor device. As a way of example, FIG. 22 diagrammatically illustrates a cross-sectional view of an exemplary photodetector having an n-p-n junction formed in an ART structure.

Figure 22:
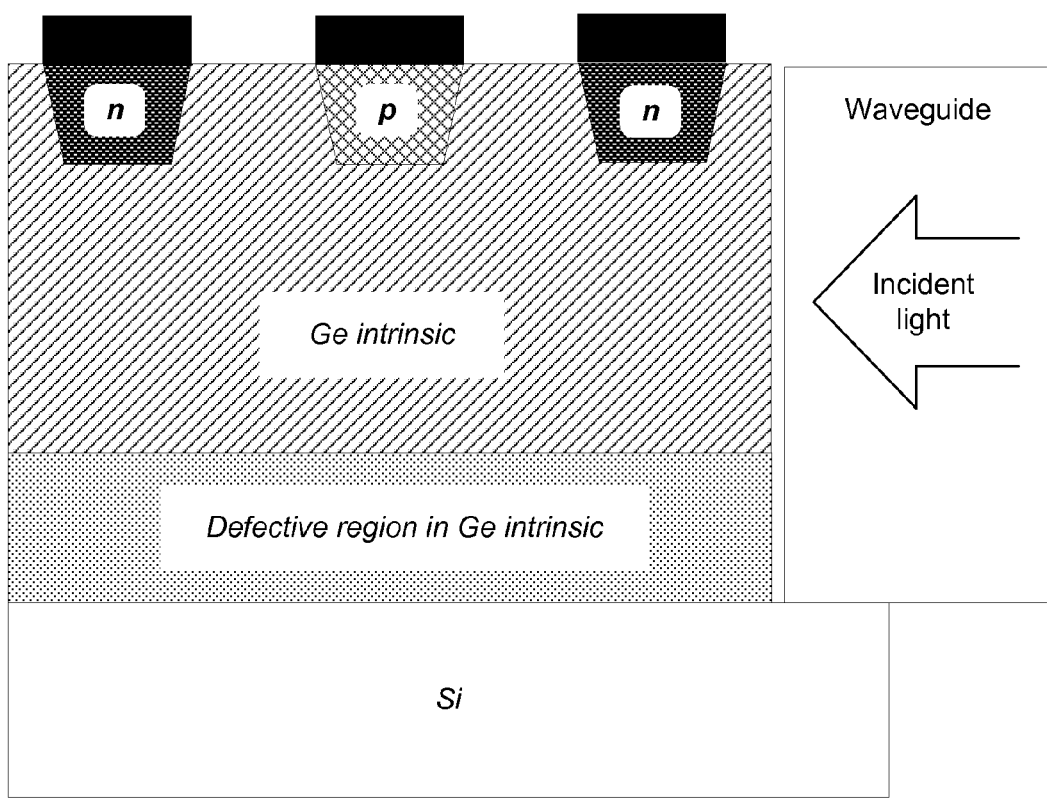
FIG. 22 is a cross-section of an exemplary semiconductor device having a non-isolated defect region.

Referring to FIG. 22, a non-silicon ART material, which is a germanium (or III-V semiconductor material) in this example, is grown within an opening on a silicon substrate. The opening can be formed from patterning of a dielectric layer deposited on the silicon substrate or can be a STI trench formed in the silicon trench.

The germanium ART structure has a defect region, such as a region comprising dislocation defects, at the bottom. The n and p regions can be formed at the dislocation-defect-free top portion of the germanium ART structure. Specifically, an n-p-n junction can be formed near the top surface of the germanium ART structure. In this example, the bottom defect region in the germanium ART structure is not electrically isolated from the n-p-n junction or the germanium intrinsic region. Light to be detected is directed from the side of the photodetector.

It is noted that the semiconductor devices, such as the photodectors as discussed above with reference to FIG. 19a through FIG. 22 can be formed in trench structures, such as STI trenches or other types of trenches. The trenches can be formed in a substrate (e.g. with dielectric layers on the sidewalls of the trenches when necessary) or can be formed in a dielectric (or insulator) layer over the substrate.

As noted above, teachings of this disclosure have a wide variety of applications. While not limited to ART technology, teachings of this disclosure have many applications within ART technology. For example, examples of the methods disclosed in this disclosure may be used to create photodetectors (e.g., IR, UV) for semiconductor devices. Further, examples of the methods disclosed in this disclosure may be used to create sensors using a p-n junction or a p-i-n structure in the sensing region (e.g., IR, UV) for semiconductor devices. A wide variety of devices may incorporate the invention. While not limiting to these devices, the invention may be particularly applicable to mixed signal applications, field effect transistors, quantum tunneling devices, light emitting diodes, laser diodes, resonant tunneling diodes and photovoltaic devices, especially those using ART technology. Application Ser. No. 11/857,047 filed Sep. 18, 2007 entitled "Aspect Ratio Trapping for Mixed Signal Applications"; application Ser. No. 11/861,931 filed Sep. 26, 2007 entitled "Tri-Gate Field-Effect Transistors formed by Aspect Ratio Trapping"; application Ser. No. 11/862,850 filed Sep. 27, 2007 entitled "Quantum Tunneling Devices and Circuits with Lattice-mismatched Semiconductor Structures"; application Ser. No. 11/875,381 filed Oct. 19, 2007 entitled "Light-Emitter—Based Devices with Lattice-mismatched Semiconductor Structures"; and application Ser. No. 12/100,131 filed Apr. 9, 2007 entitled "Photovoltaics on Silicon" are all hereby incorporated by reference as providing examples to which aspects of this invention may be particularly suited.

A silicon CMOS device may be processed prior to embodiments of the invention, therefore, embodiment of devices such as LEDs or photovoltaic devices according to the invention integrated with CMOS process may be fabricated. Further, structures and/or methods according to disclosed embodiments can be used for integration of non-Si channel or active regions for next generation CMOS and for a wide variety of other applications.

Any reference in this specification to "one embodiment," "an embodiment," "example embodiment," "example," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A method comprising:
    converting received light into a voltage signal by a sensor, the sensor being disposed in a first crystalline material, the first crystalline material being in a recess in a substrate, the recess having non-crystalline sidewalls, the substrate comprising a second crystalline material lattice mismatched to the first crystalline material; and
    amplifying the voltage signal into an amplified signal using a first transistor, the first transistor comprising a first source/drain region disposed in the second crystalline material.

2. The method of claim 1, wherein the sensor comprises a p-n junction in the first crystalline material.

3. The method of claim 1, wherein the sensor comprises a p-i-n structure in the first crystalline material.

4. The method of claim 1 further comprising reading out the amplified signal comprising selectively applying a column signal to a second transistor and a row signal to a third transistor, the second transistor having a second source/drain region disposed in the second crystalline material, the third transistor having a third source/drain region disposed in the second crystalline material.

5. The method of claim 1, wherein a dielectric material is disposed along a bottom surface of the recess, an opening being defined through the dielectric material to the bottom surface of the recess, the first crystalline material being disposed at least partially in the opening.

6. The method of claim 1, wherein a dielectric material is disposed along a bottom surface of the recess, a plurality of openings being defined through the dielectric material to the bottom surface of the recess, the first crystalline material being disposed at least partially in each of the plurality of openings.

7. The method of claim 1, wherein the first crystalline material comprises defects arising from lattice-mismatch to the second crystalline material, a majority of the defects being trapped at the non-crystalline sidewalls.

8. The method of claim 1, wherein a graded buffer material is disposed in the recess, the first crystalline material being disposed on the graded buffer material.

9. A method comprising:
forming a recess in a first crystalline material of a substrate;
forming a first non-crystalline material along sidewalls of the recess;
epitaxially growing a second crystalline material in the recess, the second crystalline material being lattice mismatched to the first crystalline material, the second crystalline material comprising defects arising from the lattice-mismatch to the first crystalline material in a lower portion of the recess, the second crystalline material in an upper portion of the recess being substantially free from defects;
forming a photodetector in the second crystalline material; and
forming a transistor at least partially in the first crystalline material.

10. The method of claim 9, wherein the photodetector comprises a lateral p-n junction in the second crystalline material.

11. The method of claim 9, wherein the photodetector comprises a lateral p-i-n structure in the second crystalline material.

12. The method of claim 9 further comprising:
forming a second non-crystalline material along a bottom surface of the recess; and
defining an opening through the second non-crystalline material to the bottom surface of the recess, the second crystalline material being disposed at least partially in the opening.

13. The method of claim 9 further comprising:
forming a second non-crystalline material along a bottom surface of the recess; and
defining a plurality of openings through the second non-crystalline material to the bottom surface of the recess, the second crystalline material being disposed at least partially in each of the plurality of openings and coalescing over the first non-crystalline material.

14. The method of claim 9 further comprising forming a graded buffer material in the recess, the second crystalline material being formed on the graded buffer material.

15. The method of claim 9, wherein a topmost surface of the photodetector extends above a topmost surface of the first crystalline material of the substrate.

16. A method comprising:
forming a trench with non-crystalline sidewalls on a first crystalline material of a substrate;
epitaxially growing a second crystalline material lattice mismatched to the first crystalline material in the trench, a lower portion of the second crystalline material in the trench having defects arising from the lattice mismatch to the first crystalline material, an upper portion of the second crystalline material in the trench being substantially free from defects arising from the lattice mismatch;
forming a p-region in the upper portion of the second crystalline material, the p-region extending from an upper surface of the second crystalline material into the second crystalline material; and
forming an n-region in the upper portion of the second crystalline material, the n-region extending from the upper surface of the second crystalline material into the second crystalline material.

17. The method of claim 16, wherein an intrinsic region of the second crystalline material is disposed between the p-region and the n-region.

18. The method of claim 16 further comprising:
forming a first contact to the p-region, the first contact being on the upper surface of the second crystalline material; and
forming a second contact to the n-region, the first contact being on the upper surface of the second crystalline material.

19. The method of claim 16, wherein the trench is formed in a non-crystalline layer over the substrate.

20. The method of claim 16, wherein the trench is formed in the first crystalline material of the substrate, a non-crystalline material being formed along sidewalls of the trench to form the non-crystalline sidewalls.

* * * * *